(12) United States Patent
Isomura et al.

(10) Patent No.: US 11,600,472 B2
(45) Date of Patent: Mar. 7, 2023

(54) VACUUM PROCESSING APPARATUS AND OPERATING METHOD OF VACUUM PROCESSING APPARATUS

(71) Applicant: HITACHI HIGH-TECH CORPORATION, Tokyo (JP)

(72) Inventors: Ryoichi Isomura, Tokyo (JP); Yuusaku Sakka, Tokyo (JP); Kouhei Satou, Tokyo (JP); Takashi Uemura, Tokyo (JP); Satoshi Yamamoto, Tokyo (JP); Hiromichi Kawasaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 15/902,837

(22) Filed: Feb. 22, 2018

(65) Prior Publication Data

US 2019/0157053 A1    May 23, 2019

(30) Foreign Application Priority Data

Nov. 17, 2017  (JP) .............................. JP2017-221441

(51) Int. Cl.
*H01J 37/18* (2006.01)
*H01J 37/32* (2006.01)
(Continued)

(52) U.S. Cl.
CPC ...... *H01J 37/32862* (2013.01); *H01J 37/185* (2013.01); *H01J 37/32743* (2013.01);
(Continued)

(58) Field of Classification Search
CPC ............. H01J 37/32862; H01J 37/3288; H01J 37/32908; H01J 37/32807; H01L 21/6719
See application file for complete search history.

(56) References Cited

U.S. PATENT DOCUMENTS

2005/0193953 A1   9/2005  Makino et al.
2014/0261182 A1   9/2014  Nakazawa et al.
(Continued)

FOREIGN PATENT DOCUMENTS

JP    2005-252201 A    9/2005
JP    2012-054491 A    3/2012
(Continued)

OTHER PUBLICATIONS

Search Report dated Jul. 13, 2021 in International Application No. PCT/JP2021/018561.
(Continued)

*Primary Examiner* — Karla A Moore
*Assistant Examiner* — Nathan K Ford
(74) *Attorney, Agent, or Firm* — Miles & Stockbridge, P.C.

(57) ABSTRACT

There is provided a vacuum processing apparatus in which at least one of the processing units includes a lower member and an upper member mounted on the lower member to be attachable and detachable that configure the vacuum container, a turning shaft member which is attached to an outer circumferential part of the base plate between the work space and the vacuum container, and has a turning shaft that moves from above the base plate when the turning shaft is connected to the lower member and the lower member turns around the connected part, and a maintenance member including an arm which is disposed above the turning shaft member and turns in a horizontal direction as the upper member is suspended, and in which the lower member is configured to be fixable at the position at a predetermined angle within a range of an angle at which the lower member is capable of turning around the shaft, and to be vertically movable as the arm of the maintenance member fixes the position above a center portion of the lower member of (Continued)

which the position is fixed within a range of the angle at which the lower member is capable of turning, and the upper member is suspended.

6 Claims, 25 Drawing Sheets

(51) Int. Cl.
    *H01J 37/34*     (2006.01)
    *H01L 21/67*     (2006.01)
    *H01L 21/677*     (2006.01)
    *H01L 21/687*     (2006.01)

(52) U.S. Cl.
    CPC .... *H01J 37/32889* (2013.01); *H01J 37/3491* (2013.01); *H01L 21/6704* (2013.01); *H01L 21/6719* (2013.01); *H01L 21/6776* (2013.01); *H01L 21/67184* (2013.01); *H01L 21/67259* (2013.01); *H01L 21/67748* (2013.01); *H01L 21/68707* (2013.01)

(56) References Cited

U.S. PATENT DOCUMENTS

| | | | |
|---|---|---|---|
| 2015/0214014 A1* | 7/2015 | Sato | H01L 21/6719 |
| | | | 156/345.54 |
| 2015/0267294 A1 | 9/2015 | Itatani | |
| 2016/0372305 A1 | 12/2016 | Uemura et al. | |
| 2019/0267219 A1 | 8/2019 | Uemura et al. | |

FOREIGN PATENT DOCUMENTS

| | | |
|---|---|---|
| JP | 2015-183211 A | 10/2015 |
| JP | 2017-010624 A | 1/2017 |
| JP | 2019-145721 A | 8/2019 |
| WO | 2013094200 A1 | 6/2013 |

OTHER PUBLICATIONS

Written Opinion dated Jul. 13, 2021 in International Application No. PCT/JP2021/018561.

\* cited by examiner

VACUUM PROCESSING APPARATUS AND OPERATING METHOD OF VACUUM PROCESSING APPARATUS

CROSS-REFERENCE TO RELATED APPLICATIONS

The present application claims priority to Japanese Patent Application No. 2017-221441, filed Nov. 17, 2017. The contents of this application are incorporated herein by reference in their entirety.

BACKGROUND OF THE INVENTION

Field of the Invention

The present invention relates to a vacuum processing apparatus for processing a substrate-like sample, such as a semiconductor wafer transported and disposed in a decompressed processing chamber on the inside of a vacuum container by using plasma formed in the processing chamber, and to a vacuum processing apparatus including a plurality of members which are disposed to be attachable and detachable at a position in an upward-and-downward direction and configure the vacuum container.

Background Art

As a semiconductor wafer manufacturing apparatus for manufacturing a semiconductor device from a substrate-like sample, such as a semiconductor wafer, an apparatus which performs processing, such as etching, with respect to a film layer that is a processing target included in a film structure having a plurality of film layers including a mask formed in advance on an upper surface of the sample by using plasma formed in a processing chamber disposed on the inside of a vacuum container, is generally known. In the plasma processing apparatus, for example, a sample which is a processing target, such as a semiconductor wafer on a sample table disposed in the decompressed processing chamber on the inside of the vacuum container, is transported, and is suctioned and held by using an electrostatic force, a processing gas is introduced into the decompressed processing chamber, an electric field or a magnetic field is supplied into the processing chamber, the processing gas is excited, and plasma is generated. Particles having activity, such as radicals contained in the plasma are attracted or moved to and come into contact with the film layer which is the processing target on the sample, and etching is performed with respect to the film layer which is the processing target by interaction including chemical reaction with a material of the film layer which is the processing target or physical reaction, such as sputtering of charged particles, such as ions.

During the processing of such a sample, a reaction product is generated in accordance with the above-described reaction in the processing chamber. Particles of the reaction product float in the decompressed processing chamber, and adhere to the inner surface of the processing chamber, such as a wall surface. As the cumulative number of samples to be processed or the cumulative time of processing increases, particles adhered to the surface in the processing chamber are deposited on the surface in the processing chamber to form a film.

The product that configures the film on which the adhering materials are deposited interacts with the plasma formed in the processing chamber, and fragments or particles of the film are liberated from the deposit or the film, float again in the processing chamber, and adhere to the surface of the sample. When the film structure for a circuit of a semiconductor device formed on the sample or the surface is contaminated due to the readherence of the product, there is a problem that the performance of the semiconductor device obtained as a result of the processing is damaged, thereby causing a defect and causing deterioration of a yield.

In addition, since the amount of interaction between the adhering materials on the surface in the processing chamber and the plasma also affects the value or distribution of the potential, density, or intensity of the plasma above the upper surface of the sample, there is a problem that a difference between an increase in adhering materials in accordance with an increase in cumulative number of processed samples or cumulative time as a result of processing at a point of time when the cumulative number and time are large and an increase at a point of time when the processing of the first one sample is started increases, deviation of the shape of the film structure of the film layer which is obtained as a result of processing from an expected shape increases in accordance with the increase in number of samples or time, and the yield deteriorates as the number of defective products of which performance does not reach the initial performance increases.

In order to solve such a problem, when it is determined that the cumulative number of processed samples or the cumulative time of the processing has reached a predetermined value, a process in which the operation of the vacuum processing apparatus is temporarily stopped, cleaning for removing substances adhered to the surface in the processing chamber is performed, and the surface in the processing chamber is restored until an expected processing result is obtained, is performed from the related art. As the means for cleaning, the vacuum container is open (open to the atmosphere) after setting the inside of the processing chamber to a pressure value which is the same as the atmosphere or equivalent to the extent of being regarded as the atmosphere, and wiping (wet cleaning) is performed with a cloth or the like using a chemical liquid with respect to the surface of the member on the inside of the processing chamber. Since particles having adherence, such as reaction products, adhere not only to the surface of the member that surrounds the processing chamber but also to the surface of a sample table in the processing chamber, it is also necessary to perform work for removing the adhering materials, such as wet cleaning, with respect to the surface at a location other than the upper surface on which at least the sample is mounted in the sample table.

When the cleaning is completed, the vacuum container is sealed again, and after this, the inside of the space is exhausted by driving a vacuum pump, such as a turbo molecular pump linked to the inner space of the processing chamber or the like in the vacuum container, and is decompressed to a predetermined degree of vacuum again. In order to perform the cleaning after becoming open to the atmosphere, it is necessary to stop the operation for processing the sample in the vacuum processing apparatus. Therefore, it is important to shorten the time for performing the cleaning work as much as possible in order to increase the availability of the vacuum processing apparatus to improve the efficiency of processing as a whole.

In order to shorten the time required for wet cleaning on the surface of the members that configure the processing chamber, it is necessary to detach the vacuum container to which the reaction products adhere being exposed to the vacuum processing atmosphere or components, and to replace the vacuum container or the component with a new product or a cleaned product. As such a technology of the related art, for example, a technology disclosed in JP-A-2017-010624 is known.

In the technology of the related art, a vacuum container which configures a processing chamber in which a sample, such as a semiconductor wafer, is processed using plasma on the inside thereof has a configuration in which a block of the uppermost discharge chamber, an upper container and a lower container which are disposed below the block, and a sample table base which supports the sample table on which a sample is mounted are stacked in the upward-and-downward direction, and the upper and lower containers vertically nip a ring member of an outer circumferential portion that surrounds the sample table of the sample table base. Furthermore, a vacuum processing apparatus in which the vacuum container is mounted on a base plate having an opening through which gas on the inside of the vacuum container is exhausted, and which includes a valve box in which a valve that opens and closes a gate of a side wall of the vacuum container is embedded on the inside by linking the side wall and the transport container to each other between the side wall of the vacuum container and a transport container in which a wafer that is a processing target is transported on the inside, is disclosed.

Furthermore, a turning lifter having a shaft in the upward-and-downward direction is attached to an outer circumferential part of the base plate, and a discharge chamber block of the vacuum container and the sample table base are linked to each other so as to be capable of rotating in the horizontal direction around the shaft of the turning lifter in the turning lifter. Therefore, the upper container and the lower container are configured to be detachable from the lower member or the base plate and to be movable to a maintenance space in a state where the discharge chamber block and the sample table base are rotated in the horizontal direction in a direction of moving away from the valve box and are moved to the maintenance space on the periphery of the vacuum container or a processing unit including the vacuum container.

By moving (withdrawing) the parts at a location where a worker can easily access the inside of the processing chamber, it is possible to improve the efficiency of the maintenance work, and to further shorten the time required for the work. In other words, according to the technology in the related art, with the above-described configuration, a technology in which, it is possible to detach a part of the container that configures the vacuum container within a short period of time, and to attach the exchange parts which have been cleaned, and thus, the maintenance time is reduced, is disclosed.

SUMMARY OF THE INVENTION

In the above-described related art, problems have arisen because consideration on the following points was insufficient.

In recent years, by using a so-called multi-chamber apparatus which includes a plurality of processing units including vacuum containers for processing samples one by one on the inside and can perform processing with respect to a sample in parallel in the processing chambers on the inside of each of the vacuum containers, the productivity per installation area of a building in which apparatuses, such as clean rooms, are installed has been improved. Furthermore, in order to further improve the productivity per unit device occupied area by reducing the occupied area per unit of the multi-chamber device, it is necessary to reduce the interval between a plurality of adjacent vacuum containers disposed in parallel so that the area occupied by the entire apparatus has been reduced.

Therefore, when performing maintenance or inspection work, such as wet cleaning, with respect to one processing unit, a space for the worker to access the inside of the target vacuum container or to perform the work with respect to the inside of the processing chamber is reduced, there is only the space for the worker to perform work only in one direction with respect to one vacuum container or for one worker to perform the work, the time for the work and the time for stopping the processing with respect to the sample by the vacuum processing apparatus become long, and there is a case where availability of the entire vacuum processing apparatus is damaged. Meanwhile, in a case where components on the inside of the vacuum container are formed of a heavy metal, such as stainless steel, or in a case where the dimension of the vacuum container increases or the weight of the components increases in accordance with the increase in diameter of the sample, there is a problem that it is difficult to open the vacuum container to the atmosphere by one worker.

In response to such a problem, it is necessary to provide a technology that can attach and detach the components on the inside of the vacuum container with a weight by which the attaching and detaching work is not possible, by one worker.

In other words, in the above-described technology of the related art, only a case where a vacuum container component or a member which configures the vacuum container, which is configured in the processing chamber and is required to be detached and replaced with a new product or a cleaned product, is sufficiently light for completely performing the attaching and detaching work only by one worker, is considered. In addition, only a case where the intervals between adjacent processing chambers in the multi-chamber apparatus are sufficiently provided, and a plurality of workers can access the inside of the vacuum container, is considered.

In particular, in the processing unit mounted in the multi-chamber apparatus, a case where, in the vacuum container of each unit, the weight of the members which surround the processing chamber on the inside of the vacuum container and configure the processing chamber, increases due to the material, and it is difficult to perform the attaching and detaching work by one worker, is generated. In particular, as the diameter of the wafer increases, the diameter of the processing chamber for the processing also generally increases. When detaching or attaching the members which configure the vacuum container by opening the processing chamber to the atmosphere, it is preferable that a plurality of workers simultaneously access the processing chamber unit or the vacuum container to perform work.

However, in a case where the interval between the adjacent processing chamber and the processing chamber is small and the maintenance space on the periphery of the processing chamber or the processing unit cannot be sufficiently ensured for the worker to efficiently perform the work, the efficiency of the attaching and detaching work is substantially damaged. In other words, in such a case, the worker cannot sufficiently apply an external force necessary for attaching and detaching the components to the component, or cannot perform the work due to a difficult posture even when the external force necessary for the attaching and detaching the components is to be applied, and thus, time during which the processing of the vacuum processing apparatus is not performed with respect to the sample that requires a long time for the work, that is, a so-called non-operation time, becomes long. Otherwise, it was a heavy burden physically and psychologically to the workers.

In this manner, problems have arisen because the related art did not sufficiently consider such points. An object of the invention is to provide a vacuum processing apparatus or an operation method of a vacuum processing apparatus which improves the efficiency of maintenance work and improves the processing efficiency of the entire apparatus.

An object of the invention is to provide a vacuum processing apparatus including: at least one vacuum transport chamber in which a wafer that is a processing target is transported in a decompressed space; a plurality of vacuum processing units each of which includes a vacuum container having thereinside a vacuum processing chamber in which the wafer disposed on the decompressed inside is processed by using plasma, and a base plate on which the vacuum container is mounted and which has an opening through which a gas from the processing chamber on the inside of the vacuum container is exhausted, and the vacuum container being coupled to the at least one vacuum transport chamber in an attachable and detachable manner; and an atmospheric transport chamber which is connected to the least one vacuum transport chamber with a lock chamber interposed therebetween, and which is constructed to transport the wafer on the inside of the atmospheric transport chamber having an atmospheric pressure, in which each of the vacuum processing unit is configured to provide a work space where a worker is capable of performing work on the periphery including a space between one of the vacuum processing units and an adjacent vacuum processing unit, or between one vacuum processing unit and the atmospheric transport chamber, in which the vacuum container of at least one of the processing units includes a sample table unit and an upper member mounted above the same table unit, and a turning shaft which is disposed at an outer circumferential position of the base plate between the work space and the vacuum container mounted on the base plate, and the turning shaft of the vacuum container includes at least one vertical shaft and a maintenance arm which is disposed above the at least one vertical shaft and which is configured to turn in a horizontal direction around a vertical shaft of the maintenance arm and to move in a vertical direction as the upper member is suspended, and in which the sample table unit is coupled to the turning shaft via said vertical shaft of the turning shaft and is configured to be capable of turning around said vertical shaft of the turning shaft and being fixed at the position at a predetermined angle above the maintenance arm in plan view from above the maintenance arm the maintenance arm vertical shaft is disposed at a position which is aligned with the said one vertical shaft of the turning shaft when viewed from above in the plan view and is configured to fix the position of the upper container in a horizontal turnable range of the maintenance arm around the maintenance arm vertical shaft such that respective centers of the sample table unit and the upper container are aligned when view from above in the plan view.

According to the invention, it is possible to provide a vacuum processing apparatus in which efficiency of maintenance work is improved and processing efficiency is improved.

DETAILED DESCRIPTION OF THE INVENTION

Figure 1A:
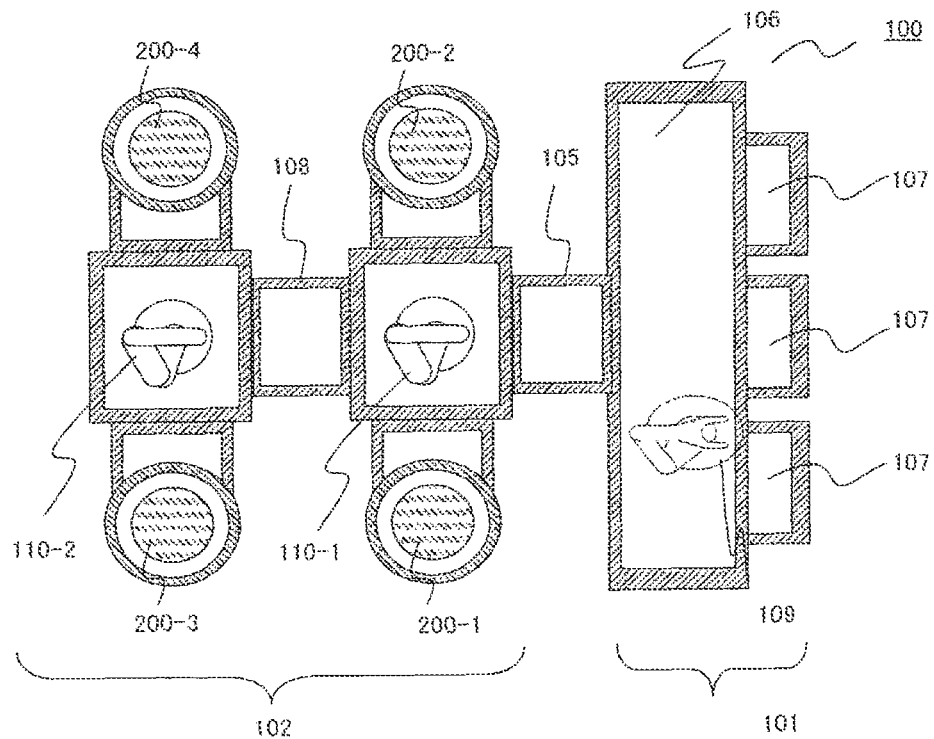
FIGS. 1A and 1B are views schematically illustrating a schematic configuration of a vacuum processing apparatus according to an embodiment of the invention.

Embodiments of the invention will be described below with reference to the drawings.

Embodiments

Hereinafter, embodiments of the invention will be described with reference to FIGS. 1 to 26. In addition, in the drawings, the same reference numerals indicate the same configuration elements, and the description of the configuration elements to which the same reference numerals are given in a plurality of drawings will be omitted.

Figure 1B:
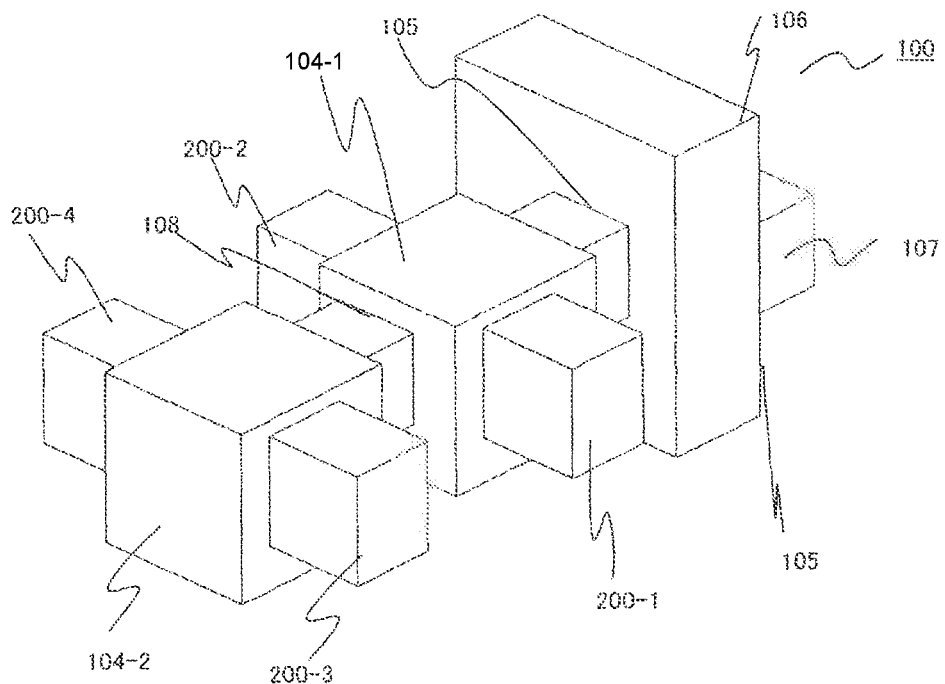

FIG. 1 is a view schematically illustrating a schematic configuration of a vacuum processing apparatus according to an embodiment of the invention. FIG. 1A is a cross-sectional view of a vacuum processing apparatus 100 according to the embodiment when viewed from above, and FIG. 1B is a perspective view illustrating a configuration of the vacuum processing apparatus 100.

The vacuum processing apparatus 100 of the embodiment includes an atmospheric block 101 disposed on a front side (right upper side in the drawing) and a vacuum block 102 disposed on a rear side (left upper side in the drawing). The atmospheric block 101 is a part to which a substrate-like sample, such as a semiconductor wafer, is transported under an atmospheric pressure to be positioned and the like to be stored, and the vacuum block 102 includes a part to which the sample is transported under the pressure reduced from the atmospheric pressure or to which the processing or the like is performed, and at which the pressure is raised and lowered in a state where the sample is placed thereon.

The atmospheric block 101 of the embodiment has an outer shape which is a rectangular parallelepiped or a shape that is equivalent to the extent of being regarded as a rectangular parallelepiped, and includes an atmospheric transport chamber 106 which is a space having an atmospheric pressure or a pressure equivalent to the extent of being regarded as an atmospheric pressure on the inside thereof; and a plurality of cassette tables 107 which are attached to be arranged side by side along a side surface of a front surface side of the housing, and in which cassettes in which samples for processing or cleaning are stored are mounted on the upper surface thereof.

In the atmospheric block 101, a wafer which is a sample for processing or cleaning stored on the inside of each of the cassettes on the cassette table 107, is at an exchange location between the cassette and the vacuum block 102 linked to the back surface of the atmospheric transport chamber 106, and an atmospheric transport robot 109 including arms for holding wafers for transporting the wafers is disposed on the inside of the atmospheric transport chamber 106.

The vacuum block 102 includes a plurality of vacuum processing units 200-1, 200-2, 200-3, and 200-4 including vacuum containers having processing chambers in which the sample is processed under a reduced pressure on the inside thereof; a vacuum container including vacuum transport chambers 104-1 and 104-2 which are transport spaces provided with vacuum transport robots 110-1 and 110-2 that are linked to the vacuum processing units and transports the sample under a reduced pressure on the inside thereof; a vacuum container which includes a lock chamber 105 which is a space that is disposed between the vacuum container (vacuum transport container) for the vacuum transport and the housing of the atmospheric transport chamber 106 and connects the vacuum container and the housing to each other and has the wafer stored therein, and is disposed to be capable of communicating with the vacuum transport chamber 104-1 and the atmospheric transport chamber 106; and a vacuum container which is disposed between two vacuum transport containers and connects the two vacuum transport containers to each other, and which includes a transport intermediate chamber 108 that is a space for wafer storage that is capable of communicating with the vacuum transport chamber 104-1 and the vacuum transport chamber 104-2 on the inside thereof.

The vacuum block 102 is a block of which the inside is decompressed and which can be maintained at a predetermined degree of vacuum pressure. The vacuum block 102 includes: a processing unit including a plurality of vacuum containers; and a vacuum transport container which is disposed between the processing units, which is linked to the plurality of processing units, and to which the sample is transported on the decompressed inside, and is configured to be capable of operating as one vacuum container in a state where the vacuum containers of the plurality of processing units are linked to each other.

In addition, the operation of the vacuum processing apparatus 100, such as an operation of transporting the atmospheric transport robot 109 or a vacuum transport robot 110, an operation of processing the wafer in the vacuum processing unit, an operation of sealing, opening, decompressing, or boosting of the inside in the lock chamber 105, and the like, is adjusted by a control device which is not illustrated and is connected to each part that executes the operations to be capable of transmitting and receiving signals via a communication path including a wired or wireless path. The control device includes: an interface which transmits and receives signals to and from external communication paths; an arithmetic unit, such as a microprocessor or the like made of a semiconductor device; and a communication line which connects software in which an operation algorithm of the arithmetic unit is written, and a storage device, such as a RAM, a ROM, a hard disk, or a removable disk which stores data, such as values of signals to be communicated.

Figure 2:
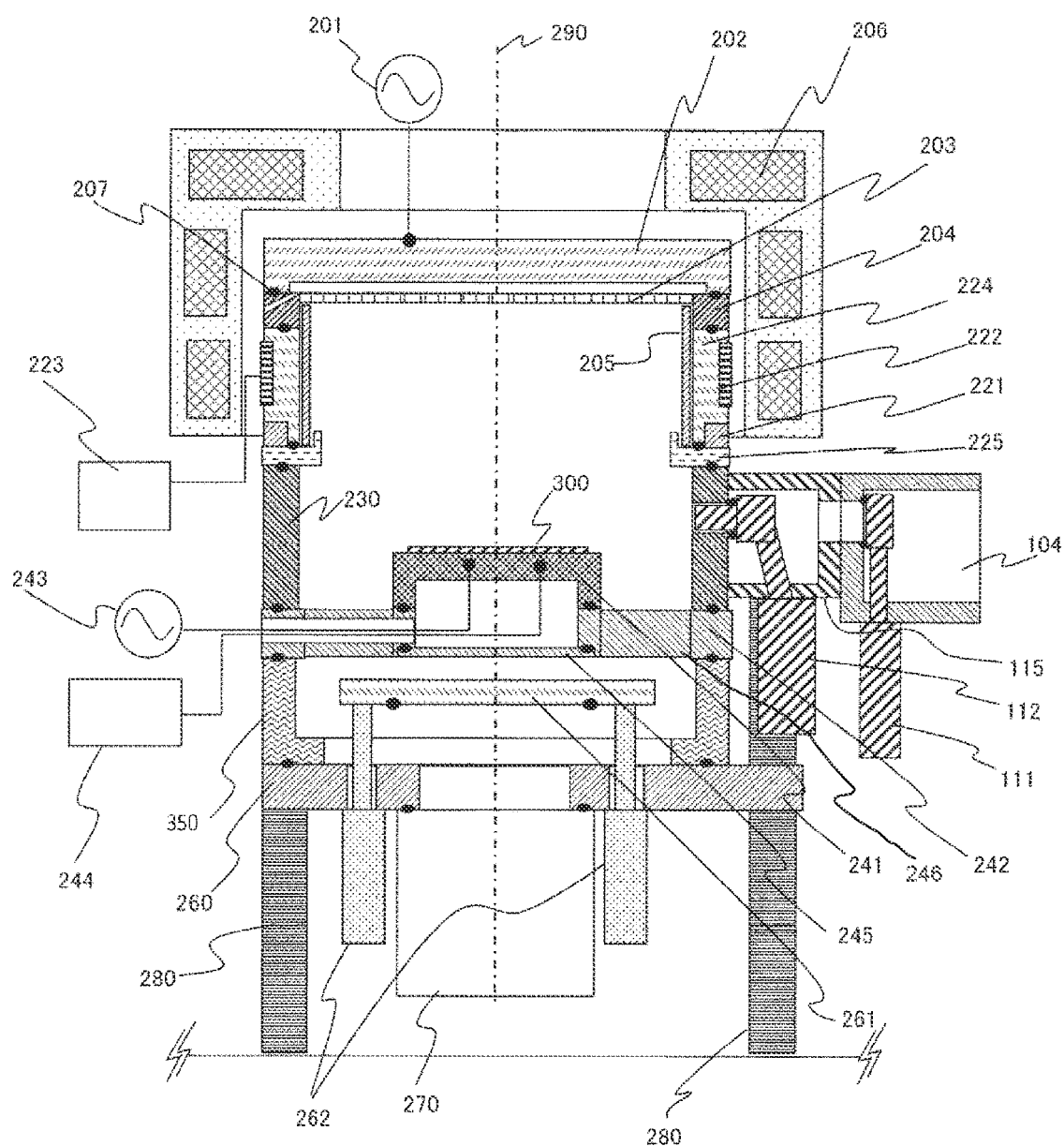
FIG. 2 is a longitudinal sectional view schematically illustrating an outline of a configuration of a vacuum processing unit of the embodiment illustrated in FIG. 1.

The configuration of the plasma processing apparatus according to the embodiment will be described with reference to FIG. 2. FIG. 2 is a longitudinal sectional view schematically illustrating an outline of a configuration of the vacuum processing unit of the embodiment illustrated in FIGS. 1A and 1B.

The structures or the operations of the apparatus in the vacuum processing units 200-1, 200-2, 200-3, and 200-4 of the embodiment are the same as each other or are equivalent to the extent of being regarded as the same structures or the operations, and even in a case where any one of these is disposed instead of other three, the processing result of the wafer is configured to obtain the same or equivalent results. In the drawing, a vacuum processing unit 200 will be described by taking any of the vacuum processing units 200-1 and 200-2 linked to the vacuum transport chamber 104-1 as an example.

The vacuum container of the vacuum processing unit 200 of the embodiment is mounted on the upper ends of a plurality of metal rod-shaped supports 380 disposed on a floor surface of a building, such as a clean room where the vacuum processing apparatus 100 is installed, and is disposed on a base plate 360 which is a metal plate member connected to the supports. The vacuum container includes a plurality of metal members mounted so as to be disposed in the vertical direction, and includes a lower container 350 having a cylindrical shape, a ring-shaped sample table base 242 including a support beam 246, an upper container 230 having a cylindrical shape, an earth ring 225, a discharge block 224 having a cylindrical shape, and a gas introduction ring 204. Furthermore, an O-ring 207 that serves as a member for vacuum sealing is disposed to be nipped between each of the members, and as a load is applied to the plurality of members from above, the O-ring 207 which is nipped being in contact with the upper and lower members are elastically deformed and the inside and the outside of the container are airtightly sealed on the upper and lower contact surfaces.

The vacuum processing unit 200 illustrated in the drawing includes: the upper container 230 including a processing chamber which is a space in which a wafer 300 is disposed and plasma is formed and processed on the inside thereof; a vacuum container including a lower container 350; an exhaust pump 370 including a vacuum pump, such as a turbo molecular pump which is linked to the vacuum container and is disposed below the vacuum container; a first high frequency power source 201 which is a device that is disposed above the vacuum container and forms an electric field for plasma formation; and a solenoid coil 206 which is a device that forms a magnetic field. The outer circumferences of the side walls of the upper container 230 and the lower container 350 are exposed to the atmosphere on the periphery of the vacuum processing unit 200, and the containers configure vacuum partition walls that airtightly partition the processing chamber on the inside of the containers and the outside atmosphere.

The upper container 230 or the lower container 350 have an inner wall having a circular section in the horizontal direction, and a cylindrical sample table 241 is disposed in the center portion on the circular inside. In the embodiment, the upper container 230 and the lower container 350 are made of stainless steel and have a weight that makes manual attachment and detachment difficult, but may have a weight that makes manual attachment and detachment possible by using a light material, such as aluminum, according to the requirement of the user of the apparatus.

The sample table 241 is held by the sample table base 242 which is a ring-shaped member and is disposed to surround the sample table 241 on the outer circumferential side, and the support beam 246 which is a beam-shaped member and extends in the horizontal direction (leftward-and-rightward direction in the drawing). The support beam 246 is disposed to be symmetric with respect to an axis (center axis 390) in the perpendicular direction that passes through the center of the cylindrical shape of the sample table 241 on the periphery thereof, that is, is radially disposed at the same angle or an angle equivalent to extent of being regarded as the same angle around the support beam 246 when viewed from above the center axis 390. Accordingly, a case where the flow rate or speed of the gas in the processing chamber which flows downward through the periphery of the side wall of the sample table base 242 becomes non-uniform around the center axis 390, is suppressed.

The gas or plasma or reaction product particles which are introduced into the processing chamber above the sample table 241 in the upper container 230 pass through a space between the support beams 246, that is, a space surrounded by the sample table 241, the support beam 246, and the sample table base 242, and flows into the space of the processing chamber surrounded by the lower container 350 below the sample table 241. Due to this, non-uniformity of the gas flow in the circumferential direction of the wafer 300 mounted on the circular placing surface of a dielectric film that configures the upper surface of the sample table 241, is suppressed, and the deviation or non-uniformity of the processed shape which is a processing result in the circumferential direction of the wafer 300 from the expected shape is reduced.

In addition, the sample table base 242 has a ring shape which surrounds the outer circumference side of the sample table 241 with the inner circumferential surface thereof connected to the outer circumference side tip end portion of the rod-shaped support beam that extends in the outer circumferential direction around the center axis 390 of the sample table 241. Since the ring part is held on the periphery of the lower container and the upper container which are vacuum containers and vacuum sealed, even when the weight of the sample table or the like increases, it is possible to respond to the increase in weight.

In addition, the lower surface of the sample table 241 having a cylindrical shape is configured with a sample table bottom portion lid 245 which is a plate member having a circular shape. A sealing member, such as an O-ring, for airtightly sealing the space between a space having the atmospheric pressure therein and the processing chamber, is attached to the inner surface of the outer circumferential part of the plate member, and is configured as a part of the sample table 241 being attached to the lower part of the sample table 241.

A space is provided in the space on the inside the sample table 241, and the space communicates with an atmosphere on the outside of the vacuum processing unit 200 via a passage disposed on the inside of the support beam 246, and the atmospheric pressure or a pressure which is equivalent to the extent of being regarded as the atmospheric pressure is maintained. The sample table 241, the sample table base 242 disposed in a ring shape on the outer circumference side of the sample table 241, the plurality of support beams 246, and the sample table bottom portion lid 245 configure a sample table unit 240 which will be described later as a unitized member.

In addition, on the inside of the inner wall surface of the discharge block 224 having a cylindrical inner wall circumferential wall surface, a quartz inner cylinder 205 having a cylindrical shape is disposed so as to cover the inner wall surface. A heater 222 is wound and attached around the cylindrical outer circumferential wall of the discharge block 224. The discharge block 224 is connected to a discharge block base 221 having a ring shape disposed below the discharge block 224, is attached to the discharge block base 221, and configures a discharge block unit 220 which will be described later together with the heater 222.

In addition, each of the upper container 230, the lower container 350, and the base plate 360 has a flange portion that extends to the outer circumferential side at the outer circumferential part thereof. For example, each of the upper container 230 and the lower container 350 has a plate-like flange portion that extends to the outer circumferential side at the upper end or the lower end part of the outer circumferential wall, and is screwed to the base plate 360 by a bolt or the like that extends to the lower base plate 360 through a through-hole disposed in the flange portion, and the position thereof is fixed onto the base plate 360.

In addition, below the vacuum container of the vacuum processing unit 200, the exhaust pump 370 including a turbo molecular pump linked to the base plate 360 having an exhaust opening 363 for discharging gas and plasma particles in the bottom portion and the processing chamber of the vacuum processing unit 200, is disposed. The exhaust opening 363 having a circular shape provided on the base plate 360 is disposed at a position at which the center of the base plate 360 matches the center axis 390 immediately below the sample table 241, or at a position equivalent to the extent of being regarded as the position.

In addition, in the embodiment, although the members which configure the vacuum container of the vacuum processing unit 200 have a cylindrical shape, even when the shape of the outer wall does not have a circular section but a rectangular section in the horizontal direction, other shapes may be employed.

In the upper portion of the vacuum container of the vacuum processing unit 200, a lid member 202 having a disc shape which configures a part of the upper end surface of the vacuum container; and a shower plate 203 having a disc shape which is disposed on the processing chamber side below the lid member 202, faces the placing surface of the wafer 300 on the upper surface of the sample table 241, and configures a ceiling surface of the processing chamber, are disposed. The lid member 202 and the shower plate 203 are members made of a dielectric material, such as quartz, and are configured to be capable of transmitting a high frequency electric field, such as a microwave, a UHF wave, or a VHF wave.

In such a configuration, the electric field generated by oscillation by the first high frequency power source 201 disposed above the lid member 202 is transmitted through a waveguide attached in accordance with high frequency, or a member for a propagation path, such as an antenna configured with a coaxial cable and a disk-shaped member, and is propagated to the lid member 202 of the vacuum container. The electric field propagated to the lid member 202 passes through the dielectric lid member 202 and the shower plate 203 disposed below the lid member 202, and is supplied into the processing chamber from above the sample table 241 downward.

In addition, in the vacuum processing unit 200 of the embodiment, the solenoid coil 206 is disposed in a vacuum container, particularly in the embodiment, on the outer circumferential side of the outer wall of the discharge block 224 and above the lid member, as means for forming a magnetic field surrounding the outer circumferential side of the outer wall and the lid member. The magnetic field generated by the direct current having a predetermined size supplied to the solenoid coil 206 is supplied into the processing chamber.

In the region having a predetermined diameter of the center portion on the periphery of the center axis of the disk of the shower plate 203, introduction holes for processing gas, which are a plurality of through-holes, are disposed. A plurality of the introduction holes are disposed above the placing surface of the sample which is the upper surface of the sample table 241 so that the processing gas introduced from the gas introduction ring 204 is supplied into the processing chamber from above the sample table 241 through the introduction holes, with intervals equivalent to each other in the horizontal direction therebetween across the entire axial symmetric region around the center axis 390 of the sample table 241.

Processing gas containing gas components of different substances having a predetermined composition is introduced into the processing chamber from above the sample table 241 with a reduced flow rate of the gas in the horizontal direction through the plurality of introduction holes that are uniformly disposed. In addition, in the embodiment, the sample table 241 on which the wafer 300 is placed is disposed on the inside of the vacuum processing unit so as to match the center axis 390 of the shower plate 203.

The processing gas introduced from a gas source, such as a gas tank that serves as a gas source (not illustrated) into a gap space between the lid member 202 and the shower plate 203 through the conduit and the passage on the inside of the gas introduction ring 204 connected to the conduit, diffuses and fills the inside of the space, and then, flows into the processing chamber through gas introduction holes which are a plurality of through-holes disposed in the center portion of the shower plate 203. The atoms or molecules of the processing gas introduced into the processing chamber are ionized or excited by the interaction between the electric field and the magnetic field supplied from the first high frequency power source 201 and the solenoid coil 206, and are made into plasma in the space of the processing chamber in the discharge block 224 above the sample table 241. At this time, the atoms and molecules of the processing gas in the plasma are dissociated, and levels of charged particles, such as ions, or the energy are raised to change into active species, such as an activated radical.

In the embodiment, the heater 222 connected to a first temperature controller 223 is wound and attached to the outer circumferential wall of the discharge block 224. In the quartz inner cylinder 205 having a cylindrical shape which configures the inner wall of the processing chamber of the discharge block 224 by the heat generated by the DC power supplied to the heater 222, and faces or is in contact with the plasma, the temperature of the inner surface is adjusted to a value within a range appropriate for processing.

According to this, adhesion of reaction products to the quartz inner cylinder 205 and the discharge block 224 is reduced. In the embodiment, the members can be excluded from the target of normal maintenance.

When carrying out processing by plasma, the processing is performed in a state where the wafer 300 is mounted on a circular placing surface on the upper surface of the sample table 241, and is held (electrostatically chucked) by being suctioned by the film static electricity of the dielectric that configures the surface.

In addition, a second high frequency power source 243 which supplies high frequency power for forming a bias potential above the wafer 300 mounted on the placing surface of the sample table 241, is electrically connected to a metal base material having a disk or a cylindrical shape disposed on the inside of the sample table 241. The high frequency power supplied from the second high frequency power source 243 to the base material that serves as an electrode has a predetermined frequency lower than the frequency of the first high frequency power, and forms a high frequency bias potential above the sample table 241 and the wafer 300 mounted on the sample table 241. Charged particles in the plasma are attracted to the film structure having a plurality of film layers including a mask previously formed on the surface of the wafer 300 in accordance with the potential difference between the high frequency bias potential and the potential of the plasma, and collide with the surface of the film layer which is the processing target, and accordingly, the interaction between the physical reaction and the chemical reaction between the radical and the wafer surface is caused, and the etching processing of the film layer which is the processing target is performed.

In addition, on the inside of the base material of the sample table 241, refrigerant flow paths disposed concentrically or spirally around the center axis 390 in the vertical direction of the sample table 241 in the radial direction in a multiple manner, are provided, a heat exchange medium of which the temperature is set to a temperature within a desirable range by a second temperature controller 244, is supplied to the refrigerant flow path, and the heat exchange medium flows through the inside of the sample table 241. After passing through the refrigerant flow path, the heat exchange medium returns to the second temperature controller 244 and is again brought to a temperature within a desirable range, and then circulates to be supplied to the refrigerant flow path, and the temperature of the sample table 241 and the wafer 300 is adjusted to a value within a range appropriate for the processing over the entire period during which the wafer 300 is processed as the wafer 300 exchanges heat with the heat exchange medium in the refrigerant flow path.

A wiring cord for power supply for supplying high frequency bias power to the sample table 241 and a pipe for heat exchange medium (refrigerant) supplied for adjusting the temperature of the sample table 241 or a wiring cord for temperature control are disposed in the conduit which communicates with the atmosphere on the outside of the vacuum processing unit 200 formed on the inside of the sample table base 242 including the support beam 246. In addition, although not illustrated, in addition to such a wiring cord, a temperature sensor and a wiring cord for an electrostatic chuck can also be disposed in the conduit.

In addition, since reaction products are likely to adhere to the upper container 230 disposed on the periphery of the sample table 241, the upper container 230 is a target member of normal maintenance.

In the embodiment, the exhaust opening 363 disposed in a circular shape at the center part of the base plate 360 having a substantially rectangular planar shape has arm portions in which an exhaust portion lid 361 having a substantial disk shape disposed above the exhaust opening 363 extends in the horizontal direction (upward-leftward-rightward direction in the drawing) on the outer circumferential side thereof, and is connected to upper end portions of the arm portions and two actuators 362 so that the exhaust portion lid 361 is supported above the upper surface of the base plate 360. The exhaust portion lid 361 moves up and down with respect to the exhaust opening 363 together with the arm portion by driving the actuator 362 in the upward-and-downward direction, the distance between the exhaust opening 363 and the exhaust portion lid 361 is increased, and conductance of the exhaust through the exhaust path linked to the lower part of the exhaust opening 363 from the processing chamber is adjusted. During the processing with respect to the wafer 300, the flow rate or speed of the gas, the plasma, or the product on the inside which is discharged to the outside of the vacuum processing unit is adjusted by the value of the conductance and the exhaust amount per unit time of the exhaust pump 370, and the pressure in the processing chamber is adjusted to a desirable degree of vacuum by the balance between the exhaust and the supply of the processing gas.

In the embodiment, the pressure on the inside of the processing chamber during the etching processing with respect to the wafer 300 is detected by a controller (not illustrated) connected to be capable of communicating with a vacuum gauge using an output from the vacuum gauge (not illustrated), and based on the detected value of the pressure, in the controller, the flow rate and speed of the exhaust gas are adjusted by the movement of the exhaust portion lid 361 in the upward-and-downward direction by the operation of the actuator 362 which received a command signal that is calculated by the controller and transmitted from the controller, and the pressure in the processing chamber is adjusted. In the embodiment, the pressure during the processing is adjusted to a predetermined value in the range of 0.1 to 4 Pa.

The processing gas and the plasma which are introduced into the processing chamber, or the reaction products during the processing are exhausted from the upper portion of the vacuum processing chamber by the operation of the exhausting means, such as the exhaust pump 370 through the space between the outer circumferential wall of the sample table 241 and the inner circumferential wall surface of the sample table base 242, and through the lower exhaust opening 363 via the lower container 350. Therefore, since the lower container 350 is exposed to the gas flow of the exhaust gas from above the sample table 241, the reaction product is likely to adhere to the surface thereof. In the embodiment, as will be described later, after the sample table base 242 is rotated and moved in the horizontal direction to be detached from above the lower container 350, the sample table base 242 can be exchanged with a sample table ring having a cleaned inner surface or a washed clean sample table ring.

In addition, during the maintenance work carried out by opening the inside of the vacuum processing unit 200 to the atmosphere, the exhaust portion lid 361 is formed so that the outer circumferential part of the lower surface of the circular center portion faces or abuts against the upper surface on the periphery of the exhaust opening 363 of the base plate 360 with the sealing member, such as an O-ring, interposed therebetween, and airtightly closes the space between the inside and the outside of the exhaust opening 363 with the O-ring interposed therebetween so as to be able to airtightly seal an inlet of the exhaust pump 370 from the outside. Since the reaction product formed in the upper processing chamber is likely to adhere to the inner wall surface of the lower container 350, the lower container 350 becomes a target member of the normal maintenance.

As the processing gas used for the plasma processing, a single type of gas or a gas mixed with a plurality of types of gases at an optimum flow rate is used for each condition of the process of processing the film layer which is the processing target of the wafer 300. The mixed gas is introduced into the space for gas retention between the shower plate 203 and the lid member 202 via the gas introduction ring 204 of which the flow rate is adjusted by a gas flow rate controller (not illustrated) and is linked thereto. In the embodiment, the stainless steel gas introduction ring 204 is used.

Figure 3:
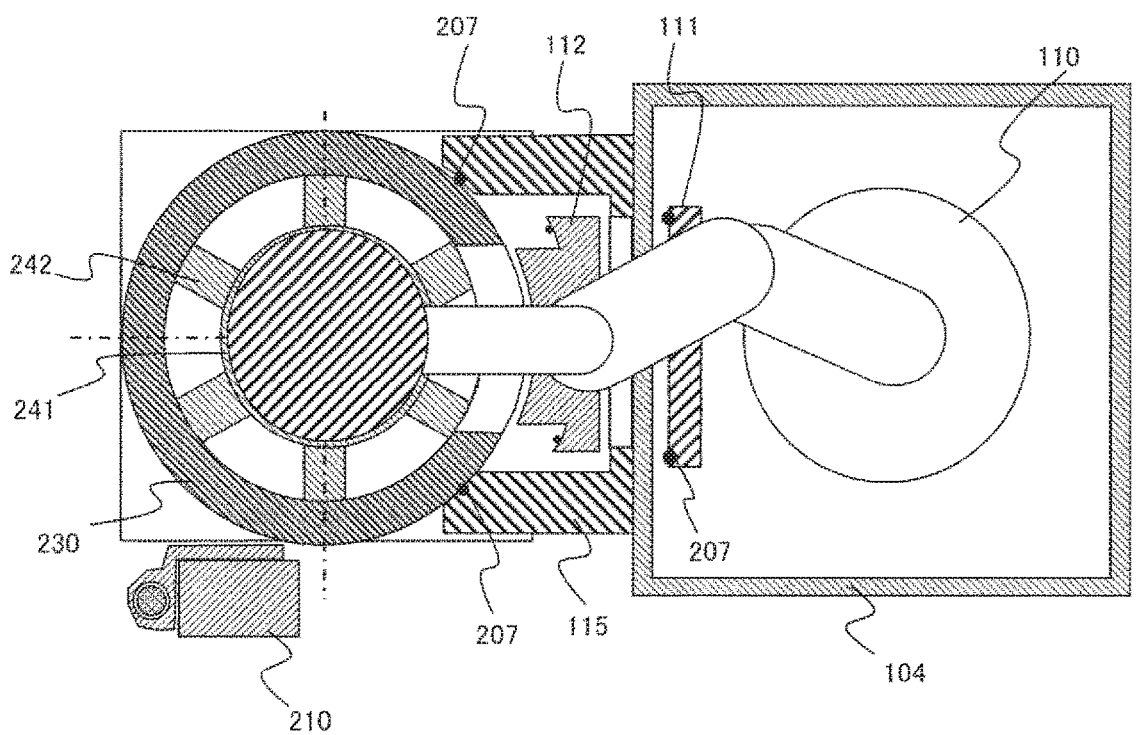
FIG. 3 is a sectional view schematically illustrating an operation for transporting a sample in and out of the inside of the vacuum processing unit by a vacuum transport robot, in the vacuum processing apparatus according to the embodiment illustrated in FIG. 1.
Figure 4:
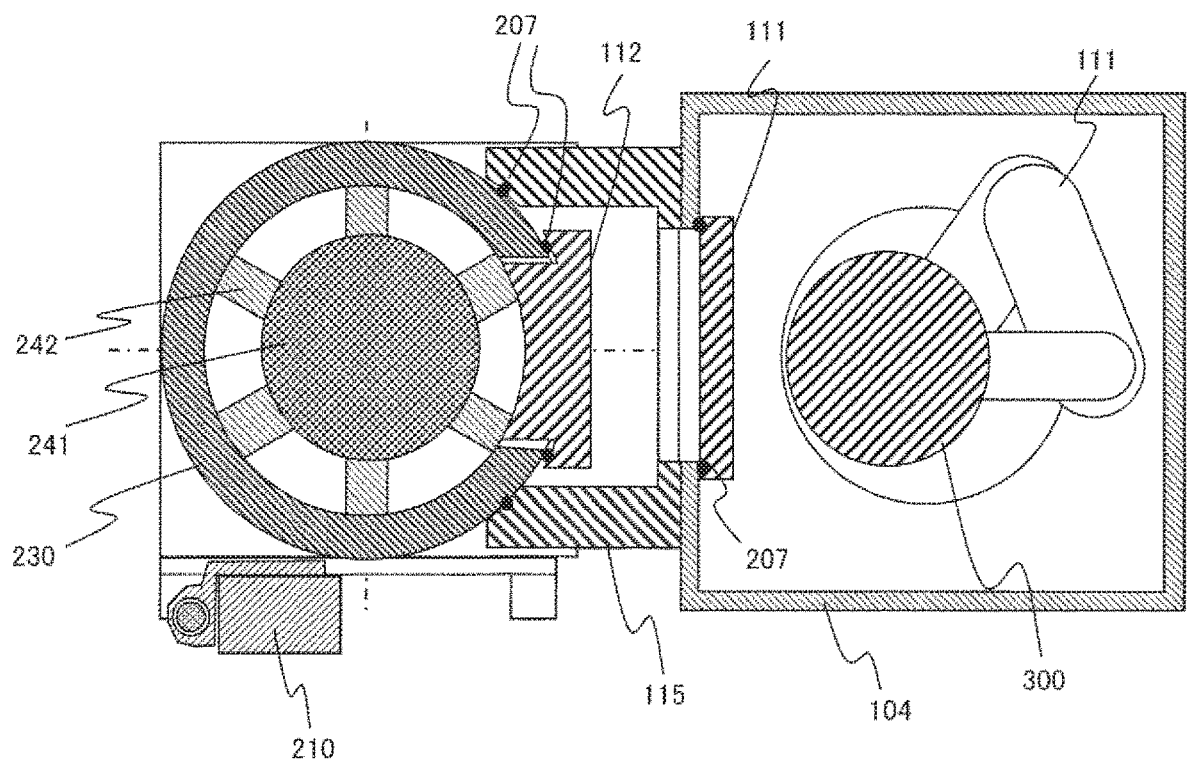
FIG. 4 is a sectional view schematically illustrating a state of a vacuum processing apparatus during processing with respect to the sample in the vacuum processing unit, in the vacuum processing apparatus according to the embodiment illustrated in FIG. 1.

With reference to FIGS. 3 and 4, an aspect of transportation of the wafer 300 between the vacuum processing unit 200 and the vacuum transport chamber 104 in the embodiment will be described. FIG. 3 is a sectional view schematically illustrating an outline of a configuration of a state during an operation for transporting a sample W (wafer 300) in and out of the inside of the vacuum processing unit by the vacuum transport robot 110, in the vacuum processing apparatus according to the embodiment illustrated in FIGS. 1A and 1B.

In the example, the vacuum processing unit 200 and the vacuum transport chamber 104 are linked in the upward-leftward-downward direction in the drawing, each of the upper container 230, the valve box 115, and the transport chamber 104 which configure the vacuum processing unit 200 is connected to each other with the sealing material, such as an O-ring, interposed therebetween and the inside of which the pressure is reduced to a predetermined degree of vacuum is airtightly sealed against the external atmosphere.

On the inside of the vacuum transport chamber 104, a vacuum transport robot 110 for transporting a sample is disposed. Each of the upper container 230, the valve box 115, and the transport chamber 104 has an opening of a gate which is a passage through which the wafer 300 passes through the inside on the side surface, and passes through the gate and the opening to transport the wafer 300 which is mounted on a holding portion disposed at the tip end portion of the arm of the vacuum transport robot 110 between the processing chamber on the inside of the upper container 230 and the transport chamber 104.

In addition, in the embodiment, two gate valves which are driven to move in the upward-and-downward direction (direction perpendicular to the paper surface in the drawing) to open or airtightly close the opening of each of the gates of the vacuum transport chamber 104 and the upper container 230. The embodiment includes: a first gate valve 111 which is disposed in the vacuum transport chamber 104 and closes the opening of the gate facing the inside; and a second gate valve 112 which is disposed on the outside of the gate of the upper container 230 and closes the opening of the gate. The first gate valve 111 is disposed on the inside of the transport chamber 104, and the second gate valve 112 is connected to the outer wall surface of the upper container 230 and is disposed between the vacuum transport chamber 104 and the upper container 230 on the inside of the valve box 115 linked to the vacuum transport chamber 104 and the upper container 230.

In a state where the first gate valve 111 and the second gate valve 112 are open, and in a state where both end portions of the plurality of beam-shaped members are linked to each other by joints in the vacuum transport robot 110 and the wafer 300 is mounted on the holding portion disposed at a tip end of an arm that makes the entire body extend and contract in a specific direction by the rotation of an actuator or a motor of each of the joint portions, as the arm extends, the wafer 300 is transported onto the placing surface of the sample table 241 in the upper container 230 from the inside of the vacuum transport chamber 104 through a plurality of gates. Otherwise, the wafer 300 which has been processed by the contraction operation of the arm is transported out from above the sample table 241 in the upper container 230 into the vacuum transport chamber 104.

FIG. 4 is a sectional view schematically illustrating a configuration of a state of the vacuum processing apparatus during the processing with respect to the sample W in the vacuum processing unit, in the vacuum processing apparatus according to the embodiment illustrated in FIGS. 1A and 1B. In the drawing, while the sample W is being processed, the opening of the gate of the upper container 230 is airtightly closed by the second gate valve 112, and the inside of the processing chamber is tightly sealed with respect to the inside of the valve box 115 and the vacuum transport chamber 104, and the sample W is processed by using the plasma formed in the processing chamber in this state. At this time, the first gate valve 111 may be open or closed.

While the second gate valve 112 is closed, a case where a valve body of the second gate valve 112 abuts against the sealing means, such as an O-ring disposed along the outer circumferential wall of the upper container 230 on the periphery of the opening of the upper container 230 and the outer circumferential edge on the abutting surface of the valve body, and the gas flow which passes through the gate, is prevented. When a projection portion is disposed in the center portion of the surface on a side that faces the outer wall surface of the upper container 230 of the valve body of the second gate valve 112 of the embodiment, and the second gate valve 112 closes the opening of the upper container 230, the wall surface on the periphery of the projection portion of the surface that opposes the outer wall surface of the upper container 230 of the valve body and the wall surface on the periphery of the opening of the upper container 230 abut against or oppose each other with the sealing member, such as an O-ring, interposed therebetween and the sealing member is deformed and the space between the inside and the outside of the opening is airtightly sealed.

In this state, the upper end surface of the projection portion has a shape having a curved surface recessed in the outer circumferential direction so as to configure the wall surface at a similar position in the radial direction to be integrated with the inner wall surface having the cylindrical shape of the upper container 230 or to the extent of being regarded as an integrated state. In other words, the projection portion disposed at the center of the valve body of the second gate valve 112 on the seal surface side is formed in a state where the second gate valve 112 closes the gate, preferably without unevenness in the radial direction with respect to the inner wall of the upper container 230, and has a shape which is extremely small, for example, an arcuate shape in which the curvature of the center axis in the horizontal direction is the same as that of the cylindrical shape of the processing chamber.

According to this, the shape of the processing chamber formed by the inner wall surface of the upper container 230 and the surface that faces the processing chamber at the end surface of the projection portion of the valve body of the second gate valve 112 configures the side surface of the cylinder to be coaxial to the center axis of the sample table 241. With such a configuration, unevenness due to the valve body of the second gate valve 112 on the inner wall surface of the processing chamber is reduced, and a case where distribution in the circumferential direction of the gas or plasma in the processing chamber is deviated due to the existence of unevenness caused by the valve body and non-uniformity occurs in the processing with respect to the sample W.

Figure 5A:
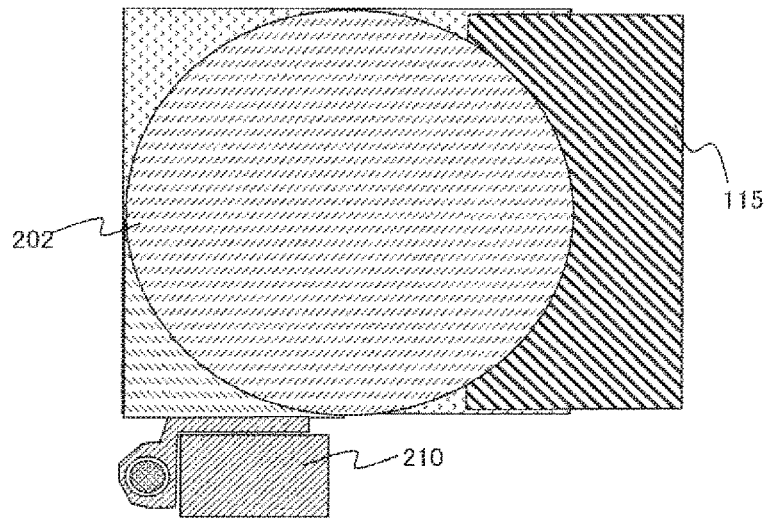
FIGS. 5A and 5B are views schematically illustrating a state where units of a first high frequency power source and a solenoid coil are detached upward from a vacuum container during maintenance, in the plasma processing apparatus according to the embodiment illustrated in FIG. 2.

With reference to FIGS. 5A to 14, a configuration for attaching and detaching the vacuum container during the maintenance of the plasma processing apparatus of the embodiment will be described. FIGS. 5A and 5B are views schematically illustrating an outline of a configuration in a state where the unit of the first high frequency power source 201 and the solenoid coil 206 is detached upward from the vacuum container during the maintenance in the plasma processing apparatus according to the embodiment illustrated in FIG. 2. FIG. 5A is a top view as viewed from above, and FIG. 5B is a longitudinal sectional view.

Figure 5B:
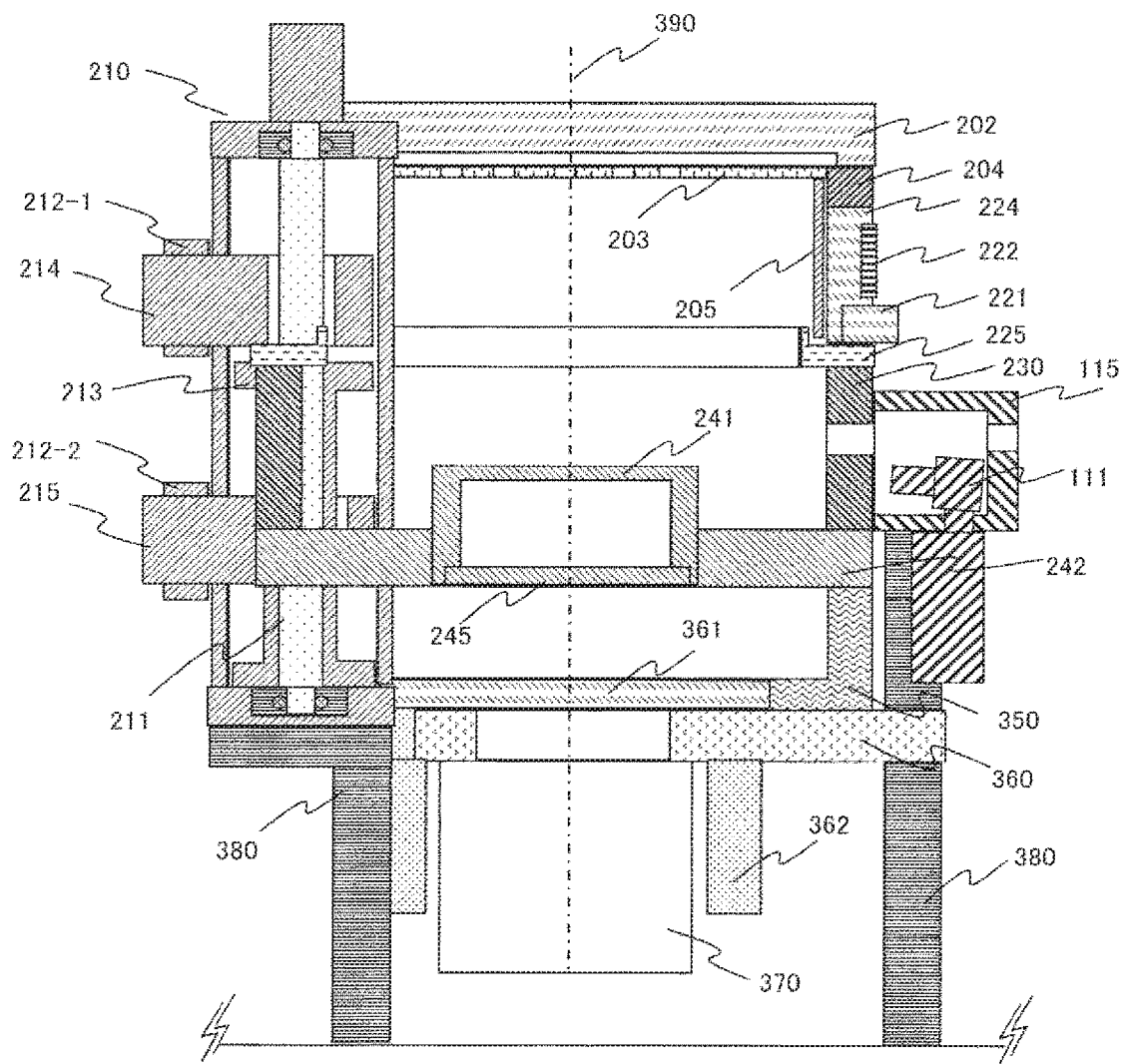
Figure 6A:
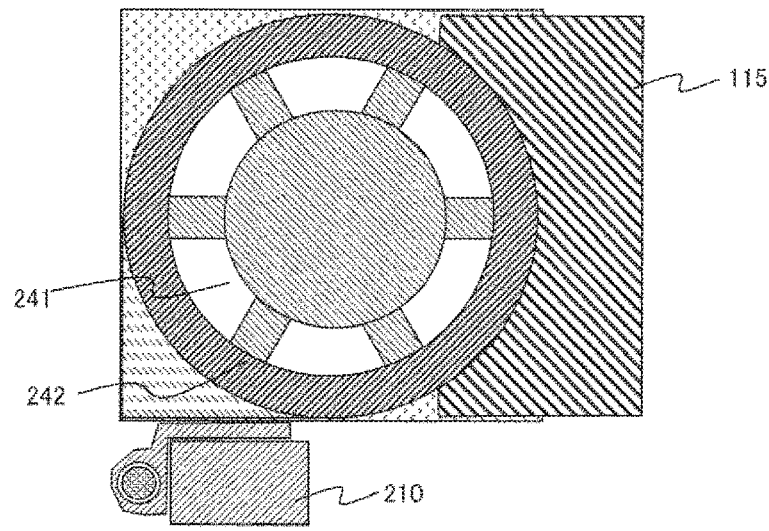
FIGS. 6A and 6B are longitudinal sectional views schematically illustrating an outline of a configuration of the plasma processing apparatus in a state where an upper member of the vacuum container is detached, in the plasma processing apparatus according to the embodiment illustrated in FIG. 5.
Figure 6B:
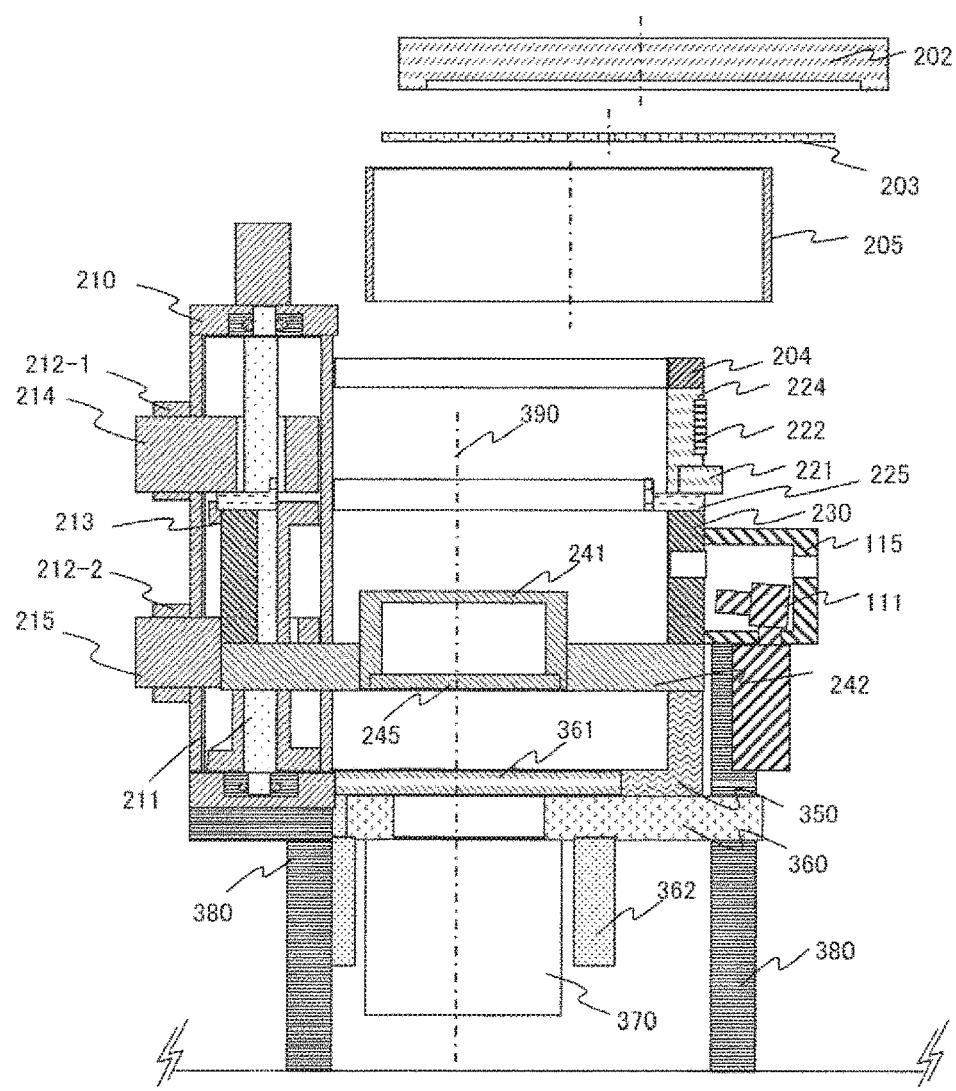
Figure 7A:
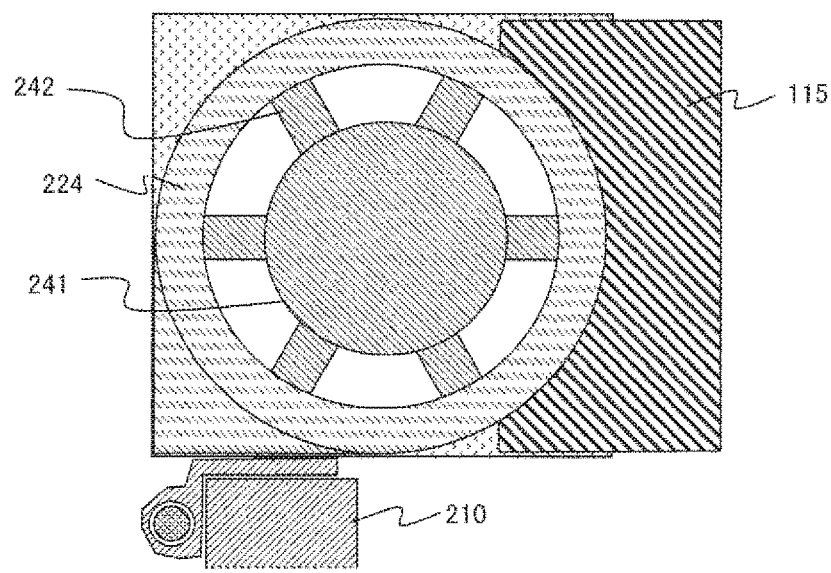
FIGS. 7A and 7B are longitudinal sectional views schematically illustrating an outline of a configuration of the plasma processing apparatus in a state where the upper member of the vacuum container is detached, in the plasma processing apparatus according to the embodiment illustrated in FIG. 5.
Figure 7B:
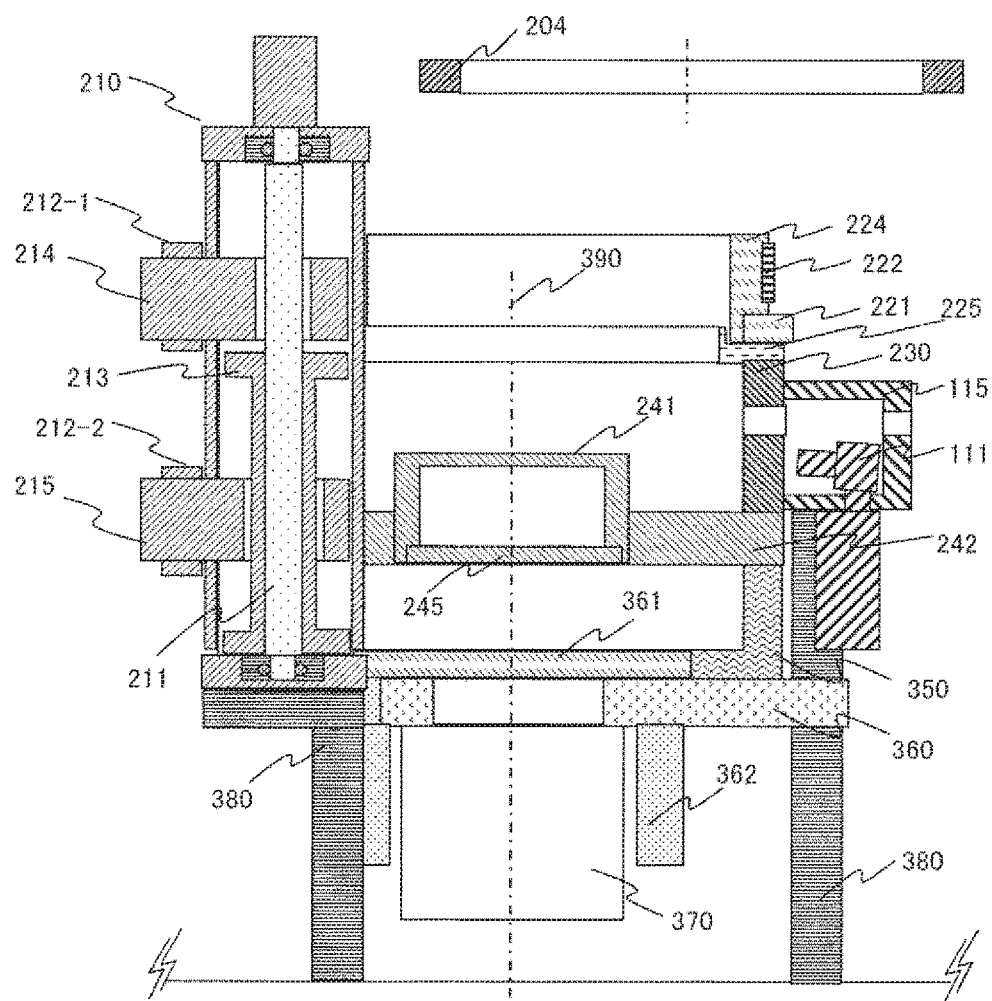

In addition, FIGS. 6A to 7B are longitudinal sectional views schematically illustrating an outline of a configuration of the plasma processing apparatus in a state where the upper member of the vacuum container is detached, in the plasma processing apparatus according to the embodiment illustrated in FIGS. 5A and 5B. Each of FIGS. 6A and 7A illustrates a top view when viewed from information, and each of FIGS. 6B and 7B illustrates a longitudinal sectional view. In the drawings, the direction of the linking between the vacuum processing unit 103 and the vacuum transport chamber 104 is equivalent to that illustrated in FIGS. 3 and 4.

In FIG. 5B, a state where the solenoid coil 206 and the first high frequency power source 201 are moved upward from the state of the vacuum processing unit illustrated in FIG. 2, and are removed from the upper and side periphery of the discharge block 224, is illustrated. Furthermore, a state of the vacuum processing unit 200 in which the exhaust opening 363 of the base plate 360 connected to the exhaust pump 370 is airtightly closed by the exhaust portion lid 361, is illustrated.

In the example, the inside of the processing chamber where the normal maintenance work is open to the atmosphere and the normal maintenance work is performed and an inlet of the exhaust pump 370 are airtightly partitioned by the exhaust portion lid 361, and in the middle of performing the maintenance work while being open to the atmosphere, the exhaust pump 370 is operated. According to this, it is possible to shorten the time required until it becomes possible to carry out the processing in the processing chamber by performing the start-up work of the vacuum processing unit 200 after being open to the atmosphere including the pressure reducing exhaust of the inside of the processing chamber to a high degree of vacuum after the normal maintenance work is completed.

After the components on the periphery of the discharge block 224 are moved, a rare gas, such as nitrogen, is introduced into the processing chamber, and the pressure on the inside of the processing chamber increases to the atmospheric pressure or a pressure slightly higher than the atmospheric pressure. In the state, as illustrated in FIGS. 6A and 6B, each of the lid member 202 which configures the upper portion of the vacuum container of the vacuum processing unit 200, the shower plate 203 which configures a ceiling surface of the processing chamber below the lid member 202, and the quartz inner cylinder 205 are moved onto the discharge block 224 and the gas introduction ring 204, and are detached from the vacuum container, in order.

In a state where the quartz inner cylinder 205 is detached from the vacuum container, the inner circumferential wall surface of the gas introduction ring 204 is exposed to the atmosphere on the outside of the processing chamber at the upper end of the vacuum processing unit 200. Furthermore, the sample table 241 and the support beam 246 of the sample table base 242 are also similarly exposed to the gas on the outside of the processing chamber. After this, as illustrated in FIG. 7B, the gas introduction ring 204 is moved upward from the upper end of the discharge block 224 and is detached from the vacuum container main body.

Here, the configuration of the turning lifter 210 provided in the vacuum processing unit of the embodiment will be described below. The turning lifter 210 is a member which is linked to the base plate 260 with the position thereof fixed to the base plate 260 on the outer circumferential side of the base plate 260, that is, on a side on which the adjacent processing unit is disposed or on a side on which the atmospheric block 101 is disposed, and which has at least one axis that extends in the upward-and-downward direction on the inside thereof. The axis is disposed in a space on the inside of the turning lifter 210, and is linked so that members which configure the vacuum container, such as the discharge block 224 and the sample table base 242, can move in the upward-and-downward direction along the axis. Furthermore, the discharge block 224 and the sample table base 242 are linked so as to be turnable around the axis in the upward-and-downward direction on the inside of the turning lifter 210.

The turning lifter 210 of the embodiment includes: one vertical shaft 211 which is a shaft in the upward-anddownward direction disposed to penetrate the internal space, and which moves along the upward-and-downward direction while each of the two containers, such as the discharge block 224 and the sample table base 242 that configure the vacuum container, are linked to each other; and two turning shafts 212 which are other shafts attached to the vertical shaft 211 in parallel at different height positions in the upward-and-downward direction of the outer wall surface of the turning lifter 210, and which move turning in the horizontal direction around the discharge block 224 and the sample table base 242 while the discharge block 224 and the sample table base 242 are linked to each other. The vertical shaft 211 is a cylindrical or columnar member which extends from the upper surface of the base plate 360 to extend beyond the upper end of the gas introduction ring 204 that configures the upper end portion of the vacuum container, and each of the discharge block unit 220 and the sample table unit 240 is linked to each other at different height positions in the vertical direction.

In other words, each of the end portions of the discharge block unit 220 and the sample table unit 240 is linked to the turning bases 214 and 215, which are metal blocks having through-holes through which the vertical shaft 211 penetrates. The turning bases 214 and 215 are held as the vertical shaft 211 penetrates and is inserted into the through-holes formed in each of the turning bases 214 and 215. Furthermore, each of the turning bases 214 and 215 is configured to be movable to different height positions in the upward-and-downward direction along the vertical shaft 211 in a state where the vertical shaft 211 is inserted and attached on inside of the turning lifter 210.

Furthermore, in a state where each of the turning bases 214 and 215 is attached to the turning lifter 210, through-holes having a center axis parallel to the axis of the through-hole through which the vertical shaft 211 penetrates is formed in advance on the outside of the outer wall, turning shafts 212-1 and 212-2 which are joint portions having cylindrical or columnar shapes in the through-hole on the outside, are held being inserted into each of the through-holes that are disposed so that the positions of each of the shafts match each other when viewed from above or are equivalent to the extent of being regarded as the positions, in a state where the turning bases 214 and 215 are inserted into the vertical shafts 211. The turning base 214 is linked to the discharge block unit 220 via the turning shaft 212-1, and the turning base 215 is linked to the sample table unit via the turning shaft 212-2. In addition, the discharge block unit 220 rotates around the center axis of the turning shaft 212-1, the sample table unit 240 rotates around the center axis of the turning shaft 212-2, and is respectively configured to be movable by rotating more than 180°, the entire unit is moved to be rotated from above the base plate 360 to the maintenance space on the periphery of the base plate 360 and is moved to a position at which the entire projection region from above is disposed on the outside of the base plate 360.

In the embodiment, each of the discharge block unit 220 and the sample table unit 240 has a cylindrical inner circumferential wall on the inside thereof, and the center of each of the cylinders is disposed at a position (so-called coaxial position) which matches the center axis 390 or is equivalent to the extent of being regarded as the position on the center axis 390 in a state where the vacuum container of which the inside is decompressed is configured. In the state, the angular position is set to 0 degrees, and the discharge block unit 220 is configured so that the angular position in the rotation direction can be fixed as a lock pin (not illustrated) disposed in the turning base 214 or the turning shaft 212-1 is fitted to a recess or a hole (not illustrated) at a position of 180 degrees in the counterclockwise direction of the turning base 214 or the discharge block unit 220 and the turning shaft 212-1. Furthermore, the sample table unit 240 is configured so that the angular position can be fixed as the lock pin and the recess or the hole (which are not illustrated) are not fitted to each other, at a position of 180 degrees in the counterclockwise direction of the turning shaft 212-2 and a predetermined angular position (25 degrees in the example) between 0 degrees and 180 degrees.

The upper container 230 is connected to the outer circumferential wall surface formed as the outer circumferential wall surface having the cylindrical shape is recessed in a cylindrical shape of the valve box 115 at the position of 0 degrees, with the sealing material, such as an O-ring, interposed therebetween. In other words, in a state where the sample table unit 240 is disposed at the position of 0 degrees around the center of the turning of the turning shaft 212-2, the valve box 115 has a recess portion having a cylindrical curved surface recessed conforming with the curvature of the cylindrical shape so as to be capable of abutting against the cylindrical outer side wall of the upper container 230 mounted on the sample table base 242 of the sample table unit 240 without a gap. In other words, the recess portion of the valve box 115 is a seat surface which abuts against the wall surface on the upper container 230 side with the sealing member interposed therebetween, and on which the sealing material which seals the space between the inside and the outside is disposed. Therefore, when detaching the upper container 230 from the top of the sample table unit 240 in a state where the upper container 230 is mounted on the sample table unit 240, the surface of the sealing material interposed between the upper container 230 and the valve box 115 or the sample table base 242 of the sample table unit 240, is scratched by the surfaces of both of the upper container 230 and the valve box 115 or the sample table base 242, and there is a concern that the sealed state is damaged due to the scratch and it is not possible to reduce the pressure to a predetermined pressure of the assembled vacuum container.

In order to suppress this, in the embodiment, regarding the sample table unit 240 and the upper container 230, in a state where the upper container 230 is mounted on the sample table unit 240, as will be described later with reference to FIG. 13, the upper container 230 is liberated from the valve box 115 by moving the sample table unit 240 upward only by a predetermined distance. After this, at a predetermined angle (25 degrees in the example) in the middle of a process of turning and moving to move away from the valve box 115 and reaching 180 degrees of the angular position, the positions of both of the turning shaft 212-2 and the turning lifter 210 in the turning direction are fixed and held by a stopper structure that uses the lock pin (not illustrated) included in the turning shaft 212-2 and the turning lifter 210. The predetermined angular position is not limited to 25 degrees in the example.

Figure 8:
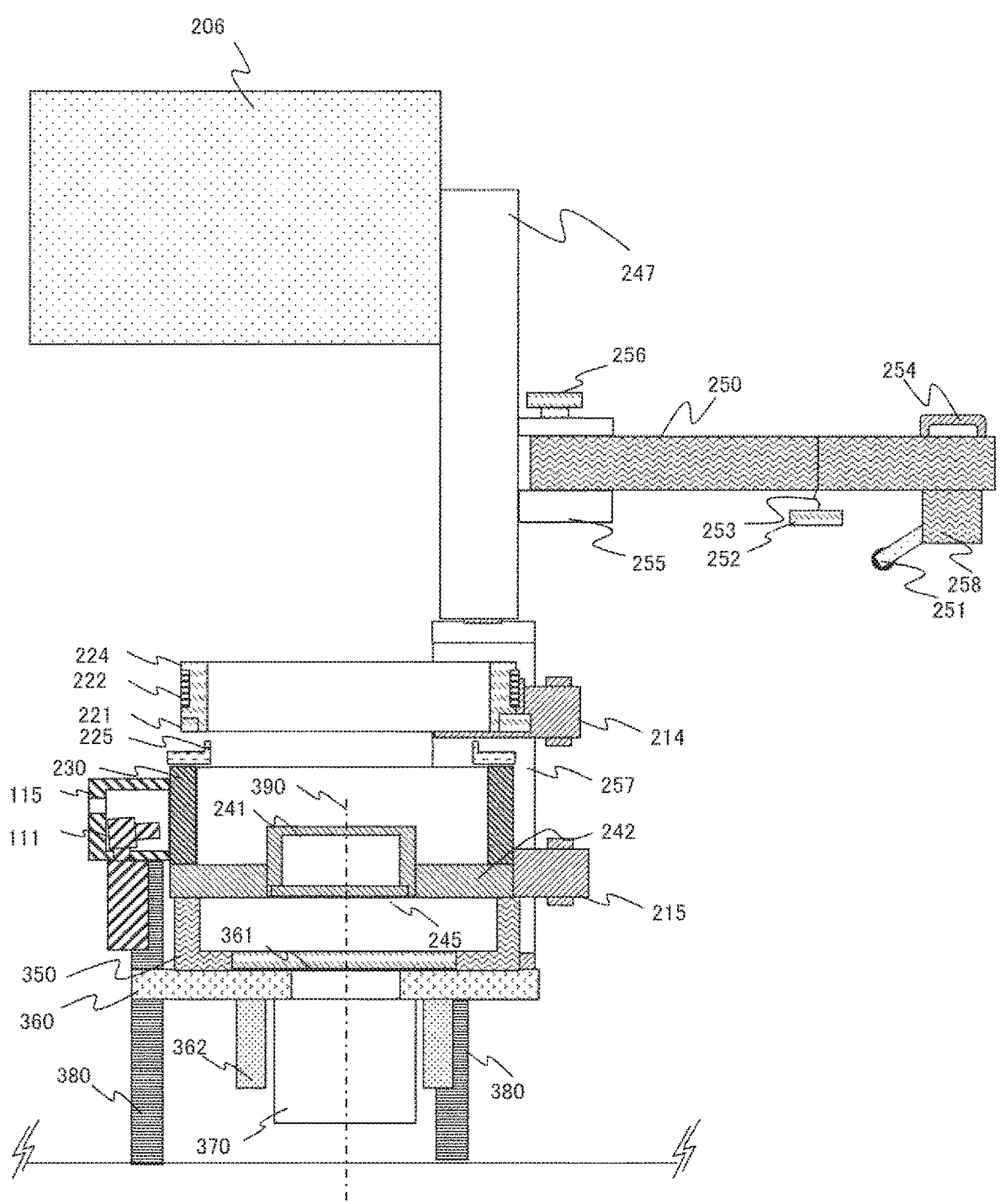
FIG. 8 is a side view schematically illustrating a configuration of a plasma processing apparatus according to the embodiment of the invention illustrated in FIG. 2, and is a view illustrating a longitudinal section of a part of the structure.

FIG. 8 is a side view schematically illustrating a configuration of the plasma processing apparatus according to the embodiment of the invention illustrated in FIG. 2, and is a view illustrating a longitudinal section of a part of the structure. In particular, a state where a maintenance arm seat 255 is attached to the turning lifter 210, and a corresponding maintenance arm 250 is linked thereto, is illustrated.

As illustrated in the drawing, the maintenance arm 250 can be attached above the turning lifter 210 of the embodiment. In other words, a solenoid coil vertical raising and lowering device 247 which is linked to the solenoid coil 206, and includes a lifter that moves vertically in the same axial direction as that of the turning lifter 210 embedded therein, is disposed above the upper end portion of the turning lifter 210, and the solenoid coil vertical raising and lowering device 247 is configured so that the maintenance arm seat 255 that can attach and fix the maintenance arm 250 on the outside of the outer wall, can be attached by a fastening member, such as a screw or a bolt.

On the maintenance arm seat 255, the end portion of the beam member of the maintenance arm 250 is mounted, the maintenance arm turning shaft 256 penetrates through both of the maintenance arm seat 255 and the maintenance arm 250 in the upward-and-downward direction, and the maintenance arm 250 is attached to the periphery thereof so as to be capable of turning and moving. In the embodiment, the maintenance arm seat 255 has a U-shaped longitudinal section in which one end portion of the maintenance arm 250 is inserted into the inside and the maintenance arm turning shaft 256 is inserted from the outer side (upper side). However, the position at which the maintenance arm 250 is attached is not limited thereto as long as the maintenance arm 250 can be attached and fixed.

In addition, the maintenance arm seat 255 may be in a state of being attached to the turning lifter 210 even in the middle of the operation in which the processing unit 200 or the like to which the maintenance arm base 250 is attached is processing the wafer 300. In the following drawings of the embodiment for describing the operation of the processing unit 200, the maintenance arm seat 255 is attached not being limited to the maintenance period of the processing unit 200.

In a case where it is necessary to detach the upper container 230, the lower container 350, and the sample table unit 240 when a worker performs the maintenance work, such as maintenance or inspection, with respect to the processing unit 200 of the embodiment having the configuration, the maintenance arm 250 is attached to the maintenance arm seat 255. Before the attachment, first, after the solenoid coil 206 is moved onto the upper end of the vacuum container by the solenoid coil vertical raising and lowering device 247, the maintenance arm 250 is inserted into the maintenance arm seat 255, and the maintenance arm turning shaft 256 is inserted through the maintenance arm seat 255 from above the maintenance arm seat 255, and is attached to be rotatable and movable around the maintenance arm turning shaft 256 so that the maintenance arm seat 255 and the maintenance arm 250 do not drop out.

Furthermore, the maintenance arm 250 may be in a state of being attached onto the upper end of the turning lifter 210 even in the middle of the operation in which the processing unit 200 of the vacuum processing apparatus 100 processes the wafer 300 for manufacturing a semiconductor device that serves as a product. In this case, the maintenance arm 250 is folded to be small in a state where the maintenance arm turning shaft 256 is inserted in the upward-and-downward direction, and is stored at a position that does not obstruct the vertical raising and lowering operation of the solenoid coil 206. In the embodiment, the maintenance arm 250 will be described hereinafter not being folded, but being attached and detached together with the maintenance arm turning shaft 256 for each maintenance.

A sensor unit (not illustrated) is attached to the maintenance arm 250, and after the maintenance arm 250 is attached to the maintenance arm seat 255 and the maintenance arm turning shaft 256 is inserted, the control device (not illustrated) provided in the vacuum processing apparatus 100 performs control so that the solenoid coil vertical raising and lowering device 247 is not driven and operated. In a case where the maintenance arm 250 can be folded to be small and an aspect of being always attached to the turning lifter 210 is selected, only in a state where the maintenance arm 250 is folded and stored by a sensor (not illustrated) is detected, the control device (not illustrated) provided in the vacuum processing apparatus 100 adjusts the transmission of the signal of the operation command to the solenoid coil vertical raising and lowering device 247 so as to drive the solenoid coil vertical raising and lowering device 247.

The maintenance arm 250 can be rotated around the center axis of the turning shaft 256 in a state of being attached to the maintenance arm seat 255 and fixed by the maintenance arm turning shaft 256. A structure in which a lock pin (not illustrated) can be attached to the maintenance arm seat 255, is achieved, the lock pin is fitted to the maintenance arm seat and the maintenance arm 250 at a predetermined angle within the range of the angle at which the maintenance arm 250 can rotate, and is fixed at the angle around the turning shaft 256 of the maintenance arm 250, and the rotation thereof is stopped, or it is possible to release the locked state of the lock pin, and to move again by rotating again from the angle.

The angular position at which the rotation of the maintenance arm 250 is stopped is an angular position at which the movement of the sample table unit 240 that rotates around the turning shaft 212-2 attached to the turning base 215 in the embodiment when viewed from above, is locked by the lock pin disposed on the turning base, and which is the same as an angle that is temporarily fixed. In other words, in the maintenance work of the embodiment, as described above, a position which is a position at which the sample table unit 240 is rotated in the counterclockwise direction by 180 degrees from the position of 0 degrees disposed so that the center axis of the sample table 241 matches or substantially matches the upper part of the center axis 390 when viewed from above, and is moved to the maintenance base on the periphery of the processing unit 200, and an arm which is a beam-shaped member of the maintenance arm 250 immediately above the center axis of the sample table 241 at each of the angular positions with a predetermined angle (25 degrees in the example) therebetween, overlap each other, and the position thereof is fixed.

A handle 254 is attached to the upper surface of the tip end of the other end portion opposite to one end portion linked to the maintenance arm turning shaft 256 of the arm of the maintenance arm 250, and when rotating the arm of the maintenance arm 250, the worker can grasp the handle 254 and perform the rotation operation by pushing and pulling the handle 254. Furthermore, the maintenance arm 250 is provided with a winch 251 at the lower surface part of the tip end of the other end portion. The winch 251 is provided with the handle, and is connected to an attachment plate 252 provided at the center part of the maintenance arm 250 by a wire 253 passed through the inside of the maintenance arm 250. As the worker rotates the handle provided on the winch 251, a plurality of gears disposed on the inside of the winch 251 rotate, the wire 253 is wound and rewound, and the attachment plate 252 performs the raising and lowering operation with respect to the arm of the maintenance arm 250.

In the embodiment, the gear provided on the inside of the winch 251 is provided with a torque holding mechanism utilizing backlash, and even in a case where a load that is equal to or greater than a specified value is applied to the wire 253, a case where the position of the gear is held and the attachment plate 252 and components connected thereto are dropped out, is suppressed. In addition, the winch 251 is manually operated, but the gear on the inside of the winch is driven by a motor operated by electric power, the worker presses a vertical raising and lowering button disposed in the housing of the controller or the like connected to the winch 251 via an electrical wiring, and accordingly, the gear on the inside of the winch 251 is operated and a winding and unwinding operation of the wire may be performed.

The attachment plate 252 is a bar or a plate-like member having a substantially rectangular planar shape, and is connected to the substantially rectangular inner container holding plate 257 which is linked to and suspends each of the upper container 230 and the lower container 350. The inner container holding plate 257 is mounted above the upper end surfaces of each of the upper container 230, the lower container 350, and the sample table unit 240 which have the same or substantially the same diameter, and is connected to each of the members by using fastening means, such as a plurality of bolts or screw members, by the worker. The upper container 230 or the lower container 350 which is connected to the attachment plate 252 and the inner container holding plate 257 is moved to be raised and lowered with respect to the base plate 360 in the upward-and-downward direction according to the winding and rewinding operation of the wire 253 as the winch 251 is driven.

As illustrated in FIGS. 5A and 5B, in the embodiment, each of the turning shafts 212-1 and 212-2 of each of the turning bases 214 and 215 is disposed on an upper left side of the drawing with respect to the vertical shaft 211 of the turning lifter 210, that is, on a side opposite to the valve box 115 or the vacuum transport chamber 104 (not illustrated) with the center axis 390 interposed therebetween of the vacuum container including the discharge block unit 220 and the sample table unit 240. In other words, the axis around which the discharge block unit 220 and the sample table unit 240 rotate in the horizontal direction is on the outside of the turning lifter 210, that is, further on the outside in the leftward-and-rightward direction with respect to the forward-and-rearward direction of the vacuum processing apparatus 100 than the vertical shaft 211 on the inside thereof.

According to this, it is possible to ensure a large angle at which the discharge block unit 220 and the sample table unit 240 can turn and move, and to move the discharge block unit 220 and the sample table unit 240 to a position which is on the inside of the maintenance space on the periphery of the processing unit 200, that is, a position which is far from the valve box 115 or the vacuum transport chamber 104 with the center axis 390 interposed therebetween of the vacuum container of the vacuum processing unit 200. By doing this, a space for the maintenance work of each unit is ensured to be greater, the work performed by the worker becomes easy, and the efficiency is improved.

On the inside of the turning lifter 210 of the embodiment, a traveling nut 213 which is a tube-like member that is disposed below the turning base 214 on the vertical shaft 211 and is disposed to penetrate the lower turning base 215 in the upward-and-downward direction, and through which the vertical shaft 211 penetrates the inside thereof. The traveling nut 213 is configured to be vertically movable along the outer circumferential wall of the cylindrical vertical shaft 211 in the direction of the center axis of the vertical shaft 211. In addition, the traveling nut 213 has a ring-shaped flange portion that extends toward the outer circumferential side at the upper and lower end portions thereof, and in a state where the traveling nut 213 penetrates the turning base 215 on the inside of the turning lifter 210 and is disposed on the outer circumferential side of the vertical shaft 211, the turning base 215 is positioned between the flange portions disposed in the upper and lower end portions.

When the traveling nut 213 moves in the upward direction by a predetermined distance or greater, the upper end portion including the flange portion abuts against the lower surface of the turning base 214. In a state where the upper surface of the upper end portion of the traveling nut 213 including the flange portion simply abuts against the lower surface of the turning base 214, both of the upper surface of the flange surface of the lower end portion of the traveling nut 213 and the lower surface of the turning base 215 have a void therebetween and are not in contact with each other. When the traveling nut 213 moves further upward, the turning base 214 and the discharge block unit 220 linked thereto move upward.

In addition, furthermore, when the traveling nut 213 moves upward, the upper surface of the flange portion on the lower end side abuts against the lower surface of the turning base 215. In the state, the upper surfaces of each of the flange portions of the upper and lower ends of the traveling nut 213 abut against the lower surfaces of each of the turning bases 214 and 215, the traveling nut 213 further moves upward, and accordingly, in accordance with the movement, the turning bases 214 and 215 connected to the inside of the turning lifter 210 also move upward on the inside of the turning lifter 210, and both of a pair of the turning base 214 and the discharge block unit 220 linked thereto and a pair of the turning base 215 and the sample table unit 240 move in the upward direction.

On the contrary, when the traveling nut 213 moves downward along the vertical shaft 211 in a state where the lower surface of the turning base 214 and the lower surface of the turning base 215 are connected to the upper surface of the flange portion of the traveling nut 213, the turning base 214 and 215 also moves downward, and both of the pair of the turning base 214 and the discharge block unit 220 linked thereto and the pair of the turning base 215 and the sample table unit 240 move in the downward direction. When the pair of turning base 215 and the sample table unit 240 continues to move downward in a state where the lower container 350 is mounted on the upper surface of the base plate 360 by matching or substantially matching an exhaust opening 363 and the shaft each other, the ring member on the outer circumferential side of the sample table base 242 of the sample table unit 240 abuts against the upper end surface at the cylindrical part of the lower container 350. Furthermore, when the traveling nut 213 moves downward, in a state where the sample table unit 240 is finally supported by the upper end of the lower container 350, the lower surface of the turning base 215 and the upper surface of the flange portion at the lower end portion of the traveling nut 213 are liberated.

In addition, in FIGS. 5A to 7B, a state where the traveling nut 213 is positioned at the lower limit of the movement range of the vertical shaft 211 in the axial direction, is illustrated. In the embodiment, in this state, a void between the lower surface of the turning base 214 and the upper surface of the upper end of the traveling nut 213 that abuts against the lower surface is set to 1 to 5 mm.

In addition, a gap between the lower surface of the turning base 215 and the upper surface of the flange on the lower end side of the traveling nut 213 that abuts against the lower surface of the turning base 215, is configured so that the discharge block unit 220 linked to the turning base 214 mounted on the upper end portion of the traveling nut 213 in a state where both of the lower surface of the turning base 215 and the upper surface of the flange on the lower end side of the traveling nut 213 abut against each other, is configured, and the lower end portion of the discharge block 224 or the lower end of the ring-shaped discharge block base 221 is higher than an upper end of a projection portion of the lower earth ring 225 only by a predetermined dimension. In the embodiment, the dimension is set to 5 cm, but the dimension is not necessarily limited thereto.

Figure 9:
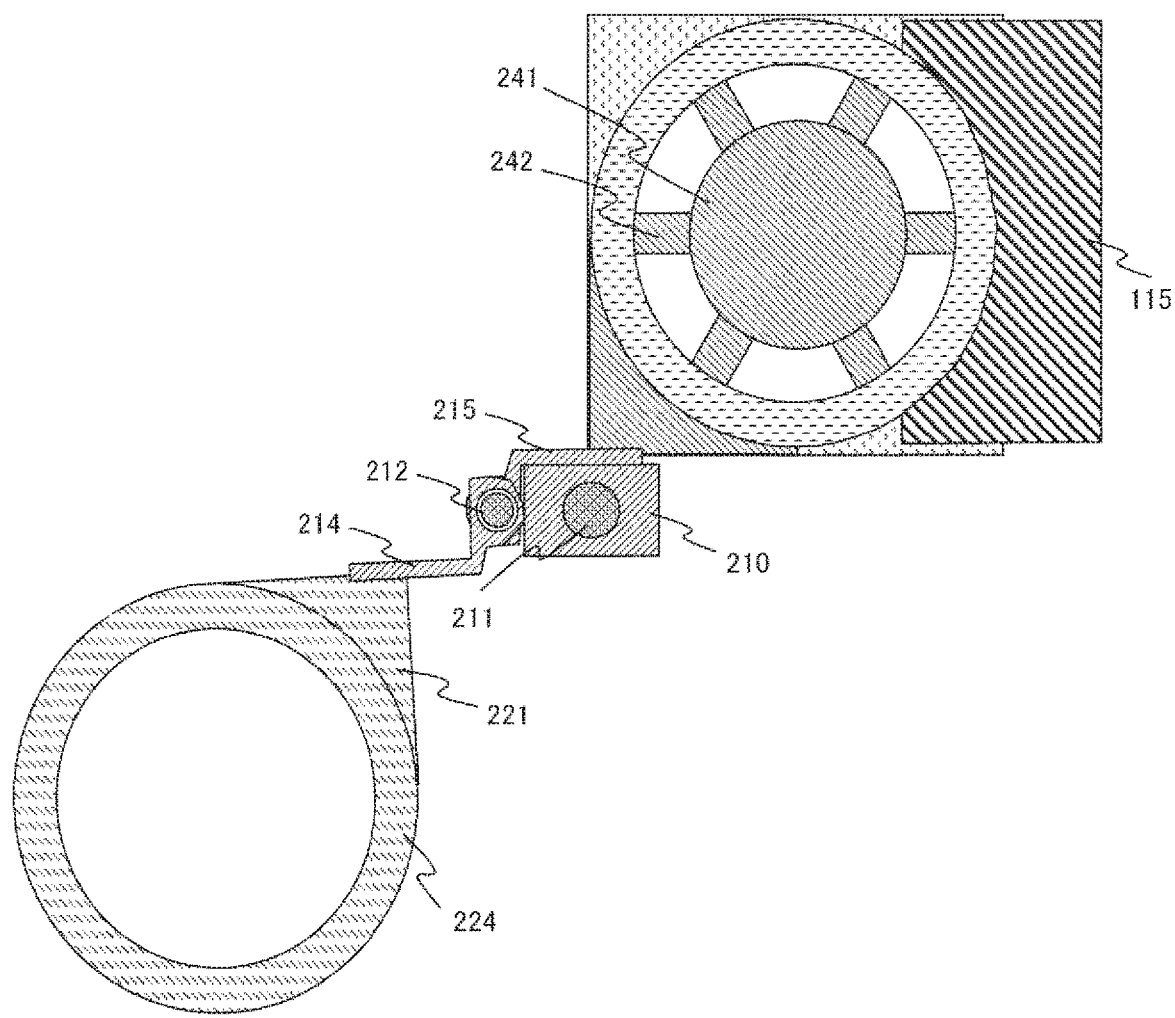
FIG. 9 is a view schematically illustrating an outline of a configuration in a state where a discharge block unit is moved in a horizontal direction from a lower vacuum container, in the plasma processing apparatus according to the embodiment illustrated in FIG. 2.
Figure 10:
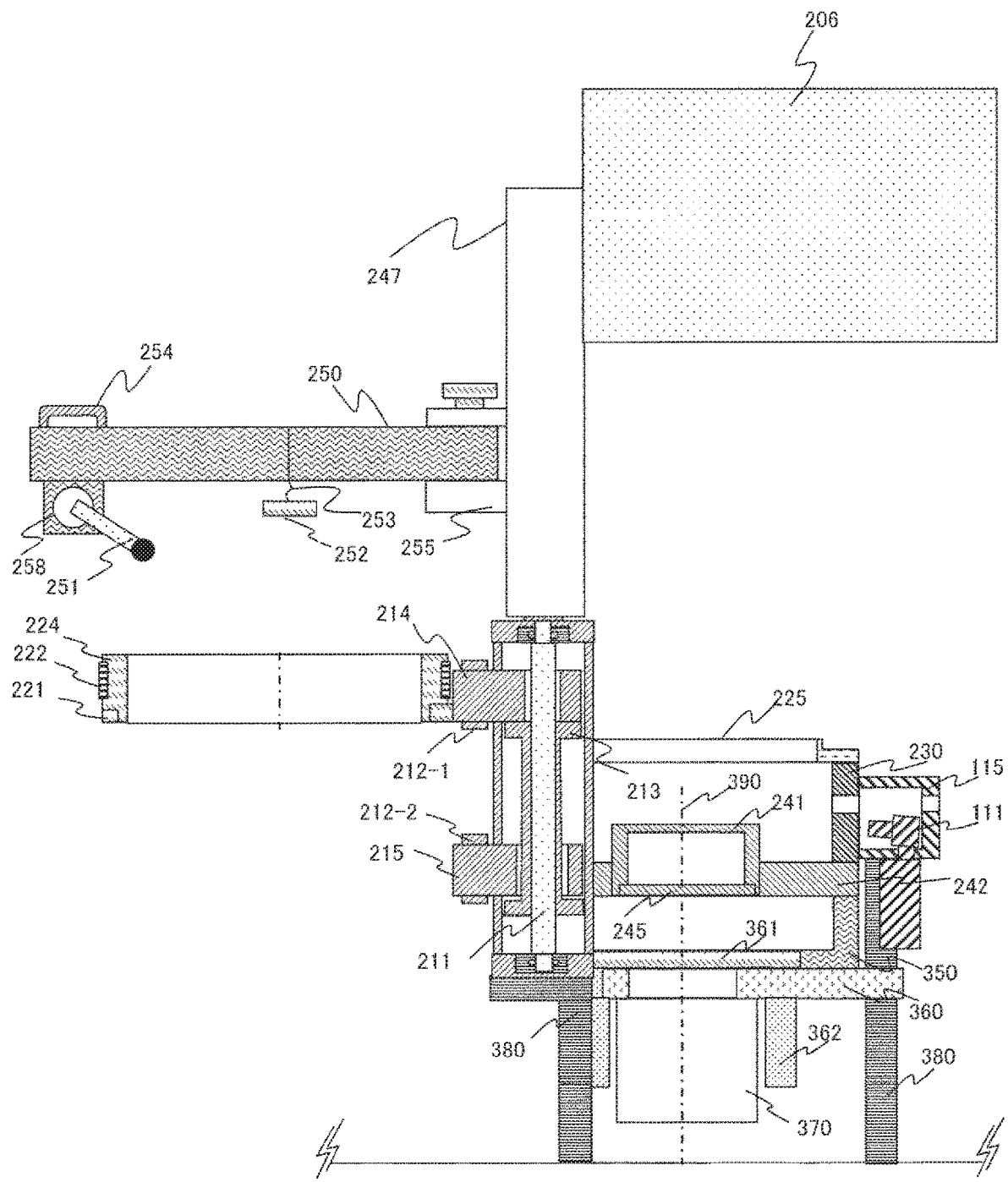
FIG. 10 is a view schematically illustrating an outline of a configuration in a state where a discharge block unit is moved in the horizontal direction from the lower vacuum container, in the plasma processing apparatus according to the embodiment illustrated in FIG. 2.

Next, as illustrated in FIGS. 9 and 10, the worker rotates the discharge block unit 220 around the turning shaft 212-1 and moves the discharge block unit 220 in the horizontal direction (the upper left direction in the drawing).

FIGS. 9 and 10 are views schematically illustrating an outline of a configuration in a state where the discharge block unit 220 is moved in the horizontal direction from the lower vacuum container, in the plasma processing apparatus according to the embodiment illustrated in FIG. 2. The discharge block unit 220 is removed from above the upper container 230 that configures the vacuum container which was at the lower part before the movement, and the entire discharge block unit 220 is moved to the space on the outside of the left and right parts when viewed from the front part of the vacuum processing apparatus 100 in the maintenance space disposed on the periphery of the processing unit 200. FIG. 9 is a top view of the plasma processing apparatus schematically illustrating a state where the discharge block unit 220 is turned and moved to the maintenance space, FIG. 10 is a side view when the plasma processing apparatus in the state illustrated in FIG. 9 when viewed from the side, and a part of FIG. 10 is a view illustrating a longitudinal section.

As illustrated in the drawings, in the embodiment, in the maintenance or inspection work of the vacuum container, in order to allow the worker to approach the container that configures the vacuum container open to the atmosphere and to detach the container or to attach a container for exchange or components on the inside thereof, as illustrated by an arrow 410 in FIG. 10, the discharge block unit 220 including the discharge block base 221 which is linked and connected to the turning base 214, and the discharge block 224 and the heater 222 which are connected and attached onto the discharge block base 221 is first turned counterclockwise horizontally around the turning shaft 212-1 after moving upward along the center axis of the vertical shaft 211, and is moved to a position rotated by 180 degrees when the position at which the center axis of the discharge block 224 and the center axis 390 of the processing chamber of the vacuum container match or substantially match each other is set to 0 degrees. In other words, the discharge block unit 220 is moved to a position on the outer circumferential side of a projection region above the base plate 360 at a location opposite to the sample table 241 and the main body of the vacuum processing unit 200 with the turning lifter 210 or the turning shaft 212-1 interposed therebetween, from the upper position in the perpendicular direction of the sample table 241 or the center axis 390 of the vacuum container.

The upward movement of the vertical shaft 211 of the discharge block unit 220 in the direction of the center axis is realized by further moving the traveling nut 213 upward together with the turning base 214 only by a predetermined distance after the upper surface of the flange portion on the upper end side of the traveling nut 213 abuts against the lower surface of the turning base 214 as a result of moving the traveling nut 213 driven by rotating the handle (not illustrated) which is linked via a gear by the worker upward along the cylindrical side wall of the vertical shaft 211. At this time, since there is a gap of 1 to 5 mm in the traveling nut 213 and the turning base 215 as described above, a state where the sample table unit 240 is mounted to be connected onto or abut against the upper end of the lower container 350 with the sealing member, such as an O-ring, interposed therebetween and the upper container 230 and the earth ring 225 are mounted above the sample table unit 240, is maintained.

In the embodiment, the distance of moving the discharge block unit 220 upward in the direction of the center axis 390 as a first stage of detaching the discharge block unit 220, is equal to or greater than the height at which the lower end of the discharge block unit 220 exceeds the upper end of the projection portion of the earth ring 225. In the embodiment, the distance is set to 5 cm, but the distance is not limited thereto.

In addition, in the embodiment, the angle at which the discharge block unit 220 is turned is 180 degrees, but the angle is selected in accordance with the specifications required by the worker and the user in the range of 90 degrees to 270 degrees. The inventors determined that a range of 180 degrees±20 degrees is appropriate considering the efficiency of maintenance work.

In the above-described embodiment, the discharge block 224, the discharge block base 221, the heater 222, and the like are turned as one unit in a state of being connected as the discharge block unit 220. This is because the amount of reaction product adhered to the discharge block unit 220 is relatively small and is not the target when performing maintenance and inspection including replacement of components of other vacuum containers. By linking the turning lifter 210 and the discharge block unit 220 to each other, the turning lifter 210 and the discharge block unit 220 can be quickly and easily moved from above the vacuum processing unit 200, the amount of work for maintenance and inspection is reduced, and the time is shortened.

The discharge block unit 220 is detached from above the vacuum container by the work illustrated in FIGS. 9 and 10, and the earth ring 225 is exposed at the upper end of the vacuum container of the vacuum processing unit 200.

Figure 11:
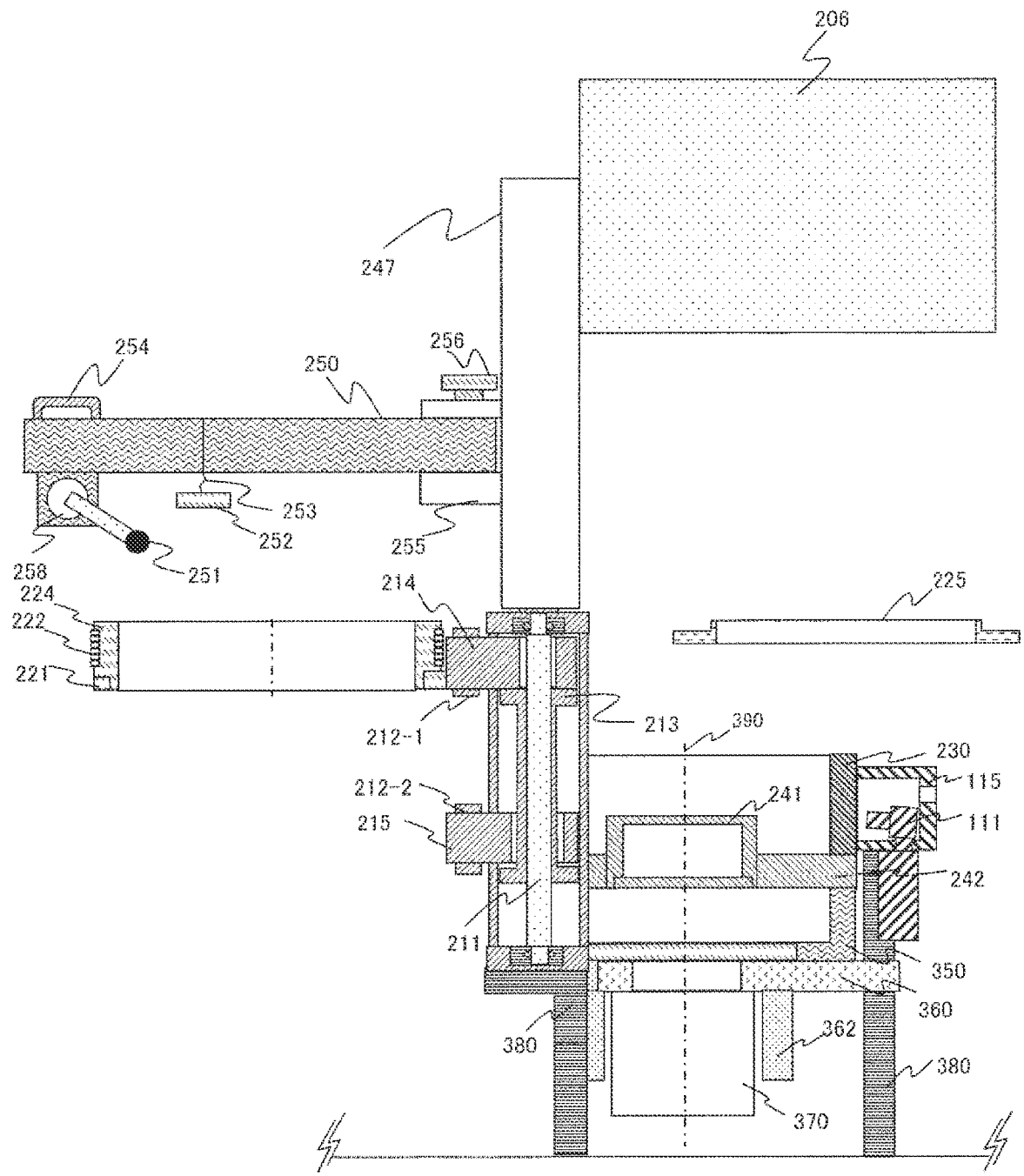
FIG. 11 is a longitudinal sectional view schematically illustrating an outline of a configuration in a state where an earth ring is detached from the state illustrated in FIG. 10, in the plasma processing apparatus according to the embodiment illustrated in FIG. 2.

Next, as illustrated in FIG. 11, the earth ring 225 is moved upward with respect to the member below the vacuum container or the base plate 260, and detached from the vacuum processing unit 200 or the vacuum container below the upper container. FIG. 11 is a longitudinal sectional view schematically illustrating an outline of a configuration in a state where the earth ring 225 is detached from the state illustrated in FIG. 10, in the plasma processing apparatus according to the embodiment illustrated in FIG. 2. In the state, the lower container 350, the sample table unit 240, and the upper container 230 above the lower container 350 and the upper container 230 are supported in a state of being mounted in this order, on the base plate 360.

Figure 12:
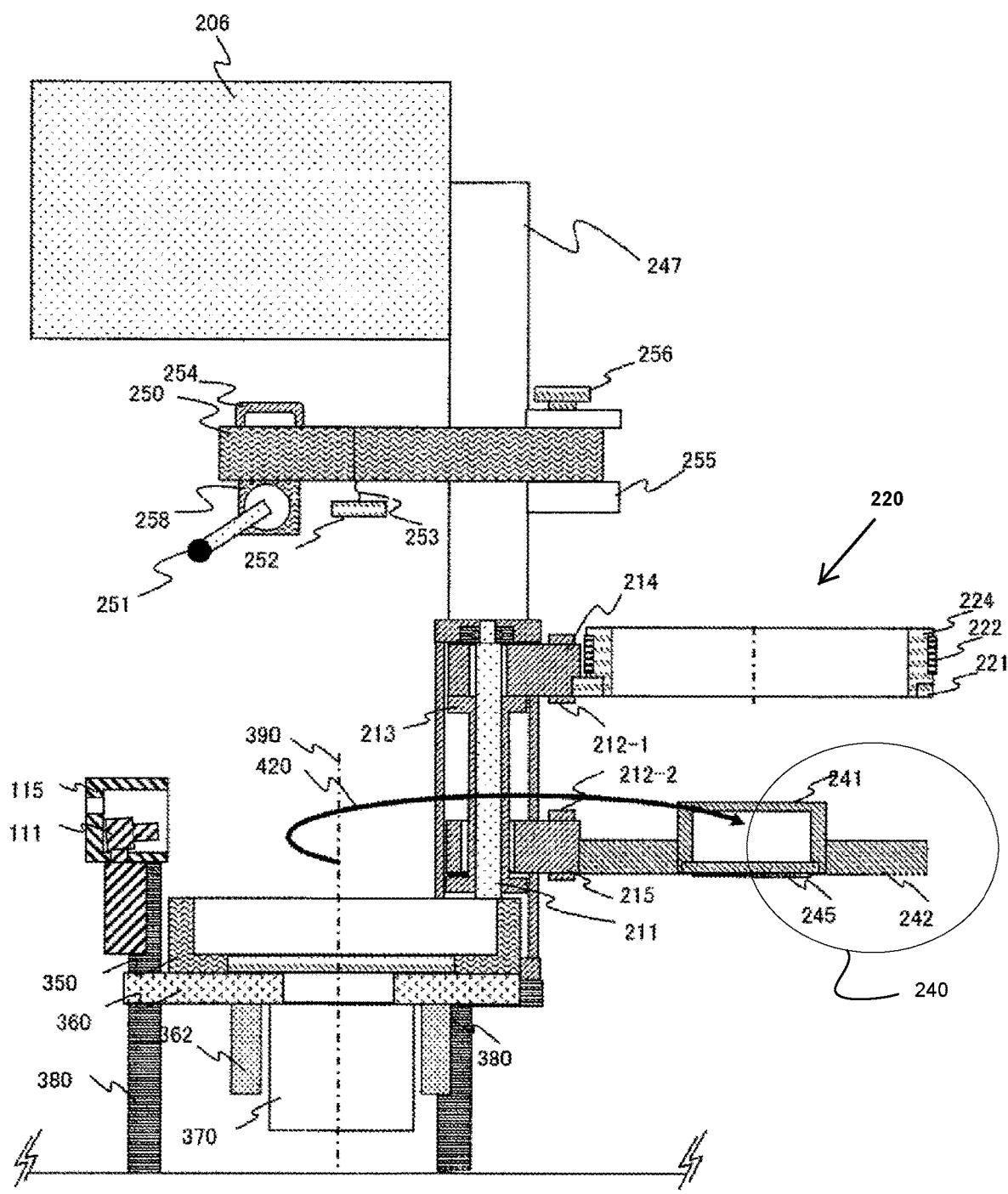
FIG. 12 is a longitudinal sectional view schematically illustrating a configuration in a state where a sample table unit is turned in the horizontal direction and moved from the state illustrated in FIG. 11, in the plasma processing apparatus according to the embodiment illustrated in FIG. 2.

After this, as illustrated in FIG. 12, the vacuum processing unit 200 of the embodiment is moved in the horizontal direction from the state where the sample table unit 240 is mounted above the lower container 350 and is connected, and is detached from above the lower container 350 and the base plate 360. FIG. 12 is a longitudinal sectional view schematically illustrating a configuration in a state where the sample table unit 240 is turned in the horizontal direction and moved from the state illustrated in FIG. 11, in the plasma processing apparatus according to the embodiment illustrated in FIG. 2.

As illustrated in the drawing, in the vacuum processing unit 200 of the embodiment, the worker detaches the sample table unit 240 from above the lower container 350, and moves the sample table unit 240 to the position of 180 degrees of the outer region of the base plate 360, from the state where the sample table unit 240 is supported at the position of 0 degrees, as illustrated by an arrow 420 in FIG. 12. In the work, in a state where upper and lower ends of both of the sample table unit 240 and the upper container 230 thereon are connected to each other, the sample table unit 240 and the upper container 230 first move upward only by a predetermined distance along the center axis 390 as a group of members, both of the sample table unit 240 and the upper container 230 are separated from each other, and the connection therebetween is released. At this time, the turning base 215 linked and connected to the sample table unit 240 rotates the handle attached to the turning lifter 210 by the worker, the traveling nut 213 which is driven via the gear linked to the shaft of the handle on the inside of the turning lifter 210 moves upward along the outer circumferential wall of the vertical shaft 211 of the turning lifter 210, and accordingly, the lower surface of the turning base 215 abuts against the upper surface of the flange portion at the lower end portion of the traveling nut 213, and stops by moving upward only by a predetermined distance together with the traveling nut 213.

After this, the sample table unit 240 rotates counterclockwise around the upward-and-downward direction of the turning shaft 212-2, is moved from above the lower container 350 and the base plate 360 left below, and is moved to the region on the outside of the base plate 360. The position of the sample table unit 240 is fixed at a position of a predetermined angle in the middle of the movement by the turning in the horizontal direction of the sample table unit 240, and the upper container 230 is detached by the worker from above the sample table unit 240 at the angular position.

Figure 13:
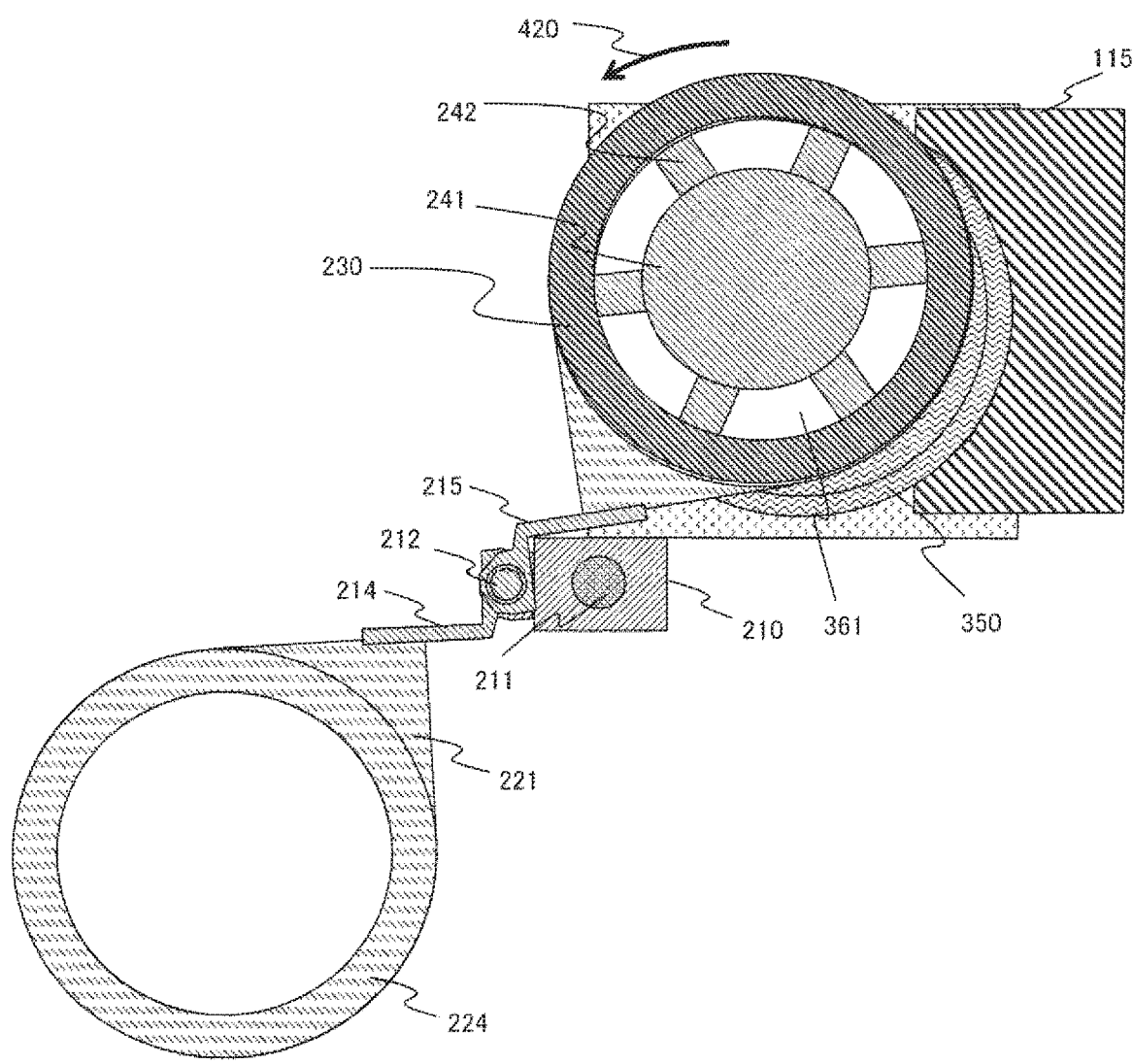
FIG. 13 is an upper view schematically illustrating a configuration in a state where an upper container and a sample table unit are turned in the horizontal direction and moved, and are detached from a side valve box and a lower container at a lower part, in the plasma processing apparatus according to the embodiment illustrated in FIG. 2.
Figure 14:
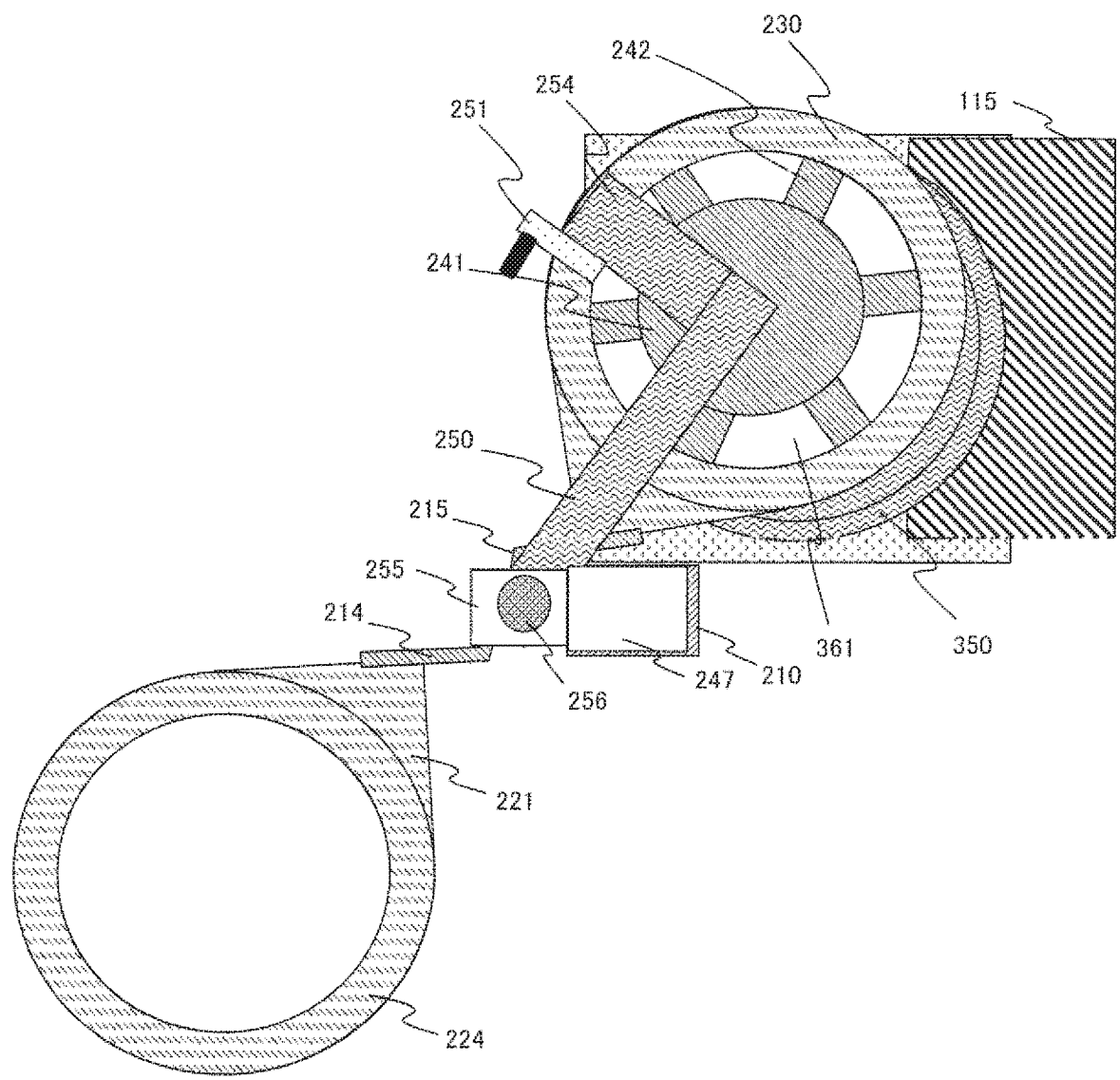
FIG. 14 is an upper view schematically illustrating a configuration in a state where the upper container and the sample table unit are turned in the horizontal direction and moved, and are detached from the side valve box and the lower container at a lower part, in the plasma processing apparatus according to the embodiment illustrated in FIG. 2.

In other words, as illustrated in FIGS. 13 and 14, a sample table unit 240 including: a sample table base 242, a sample table 241, and the sample table bottom portion lid 245 which are linked and connected to the turning base 215 of the turning lifter 210; and the upper container 230 in a state of being mounted and connected onto the upper end of the sample table base 242, are rotated in a direction illustrated by an arrow 420 in the drawing around the shaft in the upward-and-downward direction of the turning shaft 212-2 connected to the turning base 215 by the worker, and are turned by 25 degrees counterclockwise horizontally, from the position of 0 degrees at which the shaft in the upward-and-downward direction of the sample table unit 240 matches or substantially matches the center axis 390. FIGS. 13 and 14 are upper views schematically illustrating a configuration in a state where the upper container 230 and the sample table unit 240 turn in the horizontal direction and move, and are detached from the side valve box 115 and the lower container 350 at the lower part, in the plasma processing apparatus according to the embodiment illustrated in FIG. 2. When reaching the angular position of 25 degrees, a lock pin (not illustrated) disposed on the turning base 215 or the turning shaft 212-2 is fitted to both the turning base 215 and the turning shaft 212-2, and accordingly, a relative position of the turning shaft 212-2 or the turning base 215 with respect to the turning lifter 210 to which the turning shaft 212-2 is attached, is fixed.

In this state, the worker can detach the upper container 230 upward from the sample table unit 240 or the sample table base 242. At this time, regarding the maintenance arm 250 attached onto the upper end of the turning lifter 210, since the upper container 230 is disconnected from the valve box 115 and the upper container 230 and the valve box 115 are separated from each other, when the upper container 230 is attached to and detached from the sample table unit 240, a case where the sealing member, such as an O-ring, disposed on the seat surface of the cylindrical recess portion of the valve box 115 is twisted or scoured and damaged, is suppressed. Furthermore, since the work for detaching the upper container 230 is performed in a state where the upper container 230 and the sample table unit 240 that serve as a unit are fixed at a predetermined angle, a case where the sample table unit 240 which is capable of turning and moving moves without intention in the middle of work, or comes into contact with the worker or other members, is suppressed, and the safety and the efficiency of work are improved.

In addition, in the embodiment, when it is determined that the cumulative number of wafers 300 processed in the arbitrary vacuum processing unit 200 or the cumulative time of processing with respect to the wafer 300 using the plasma of the processing unit 200 exceeds a predetermined value, the control device of the vacuum processing apparatus 100 (not illustrated) sends a command for stopping the operation of a mode for manufacturing a semiconductor device that serves a product by delaying the start of the processing of the next wafer 300, and further sends a command signal for starting the operation in the maintenance and inspection (maintenance) mode of the vacuum processing unit 200 to the vacuum processing unit 200. In the mode of operation for maintenance and inspection, the upper container 230 in which a relatively large amount of the reaction product which configures the inner wall surface of the processing chamber of the vacuum processing unit 200 and is formed during the processing adheres to the inner surface thereof, is exchanged (swapped) with a new product or another cleaned upper container 230 having the same configuration, such as the shape or the material, of which the inner wall surface is cleaned.

In addition, each of the vacuum processing units 200-1 to 200-4 in the embodiment has a configuration in which one turning lifter 210 is disposed in the end portion on the upper and lower sides of the drawing of the base plate 360, that is, at a position (on the left lower side of the sample table 241 or the earth ring 225 in FIG. 8) at which the discharge block unit 220 or the sample table unit 240 can be turned in the counterclockwise direction, and the discharge block unit 220 or the sample table unit 240 is moved by the turning, and is moved and detached from the region above the member that configures the lower vacuum container, but the position at which the turning lifter 210 is disposed is not limited thereto. A configuration of being disposed at the end portion of the upper part of the drawing of the sample table unit 240 of FIG. 9, that is, at the end portion of the base plate 360 at a position on an opposite side with the sample table 241 interposed therebetween of the valve box 115 or the center of the earth ring 225, and of being capable of turning and detaching any of the discharge block unit 220 or the sample table unit 240 in the clockwise direction, may be employed, and the plurality of turning lifters 210 may be disposed in one of the vacuum processing units 200-1 to 200-4.

However, each of the vacuum processing units 200-1 to 200-4 has a work space where the worker stands and performs the work with respect to each of the vacuum processing unit 200, the vacuum transport chamber 104, the lock chamber 105, and the atmospheric transport chamber 106, between the vacuum processing units 200-1 to 200-4 and the adjacent vacuum processing unit or an atmospheric transport chamber 106 on the left and right sides in the horizontal direction with respect to the direction in which the arm of the vacuum transport robot 110 expands and contracts and the wafer 300 is transported. Meanwhile, in a case where the turning lifter 210 is disposed between the work space and the vacuum container of the vacuum processing unit 200, since the turning lifter 210 exists between the worker and the vacuum container of the vacuum processing unit 200, there is a concern that the performance of efficient work with respect to the vacuum container is obstructed. In particular, when performing the maintenance of a member having a large weight, such as attachment and detachment of the upper container 230 and the lower container 350 is efficiently performed by a plurality of workers, but in a case where a plurality of turning lifters 210 are disposed at a plurality of locations on the periphery of the vacuum container, there is a concern that any of the turning lifters 210 may obstruct work performed by each of the workers from a plurality of directions on the periphery of the vacuum container.

Therefore, it is desirable that the turning lifters 210 of each of the processing units 200-1 to 200-4 are disposed so that the plurality of workers are positioned on the periphery of the vacuum container and the work can be efficiently performed. In the embodiment, the turning lifters 210 are attached to the outer circumferential part of the base plate 360 of each of the vacuum processing units 200, that is, the outer circumferential part of the base plate 360 between the vacuum container and the adjacent vacuum processing unit or the atmospheric transport chamber 106. In other words, the turning lifter 210 is not disposed on each side of any of the far part and the left and right parts of the wafer 300 in the transport direction of the base plate 360 having a substantially rectangular shape when viewed from above.

Two workers are positioned in the work space that corresponds to each side, and can disassemble and assemble the vacuum container. Furthermore, the turning lifter 210 is not disposed at the outer circumferential part of the base plate 360 that corresponds to the side on the far side. In a case where the turning lifter 210 is attached to the position, when the discharge block unit 220 or the sample table unit 240 is horizontally turned around the periphery thereof and moved to the work space, there is a concern that the units approach and collide with any of the adjacent vacuum processing units 200 or the atmospheric transport chamber 106. In this case, in order to prevent this, it is necessary to increase the distance to the adjacent vacuum processing unit 200 or the atmospheric transport chamber 106, and the area occupied by the vacuum processing apparatus 100 becomes large and the number of the vacuum processing apparatuses 100 that can be installed in the building, such as a clean room in which the vacuum processing apparatus 100 is installed decreases.

More specifically, the turning lifters 210 of each of the vacuum processing units 200-1 to 200-4 in the embodiment are disposed in the outer circumferential end portion of the base plate 360 between the vacuum processing units 200-1 to 200-4 and the adjacent vacuum processing units and between the vacuum processing units 200-1 to 200-4 and the maintenance space, in the transport direction of the wafer 300 or in the leftward-and-rightward direction when viewed from the front of the vacuum processing apparatus 100, that is, at a position that is further on the outside (in the leftward-and-rightward direction of the vacuum processing apparatus 100) than the center axis 390 of the vacuum container with respect to the valve box 115 or the vacuum transport chamber 104. In other words, the outer circumferential wall of the upper container 230 on which the sample table unit 240 is mounted on the position of 0 degrees and the seat surface of the recess portion of the valve box 115 that abuts against the outer circumferential wall, are attached and connected to the outer circumferential portion of the base plate 360 as the turning lifter 210 is positioned so that the turning shaft 212-2 is disposed at a position at which it is possible to suppress damage caused by the collision when the outer circumferential wall of the upper container 230 mounted on the sample table unit 240 turns in the horizontal direction in accordance with the rotation around the turning shaft 212-2 of the sample table unit 240.

For example, in the embodiment, the center axis 390 of the sample table unit 240 at the position of 0 degrees is positioned at a position on the outside in the rightward or leftward direction (the transport direction of the wafer 300) when viewed from the front of the vacuum processing apparatus 100, by a line that links a position on the outermost side (the angle is the largest at the angular position around the center axis of the sample table 241) on the cylindrical seat surface of the upper container 230 mounted on the sample table unit 240 and connected to the valve box 115, and the turning shaft 212-2, or by a surface in the perpendicular direction that overlaps the line, when viewed from above. According to this, when the sample table unit 240 is turned and moved from the position of 0 degrees around the turning shaft 212-2 linked via the turning base 214, a case where the location that abuts against the seat surface of the recess portion of the valve box 115 of the outer circumferential wall of the upper container or a surface on the periphery of the location approaches the seat surface again in the middle of movement by the turning, is suppressed, and the location or the surface is similarly separated from or approaches the seat surface in accordance with an increase or a decrease in angle by which the turning is performed. Therefore, a case where both of the upper container 230 and the valve box 115 collide with each other or are damaged due to disassembling or assembling work including detachment of the vacuum container or a turning operation of the sample table unit 240 in the middle of the disassembling or assembling work, is suppressed.

Next, with reference to FIGS. 15 to 20, in the vacuum processing apparatus 100 of the present embodiment, a procedure of detaching the upper container 230 from the vacuum container or the lower sample table unit 240 using the maintenance arm 250 and the winch 258 will be described. FIGS. 15 to 21 are side views or longitudinal sectional views schematically illustrating an outline of a configuration during the work for detaching the upper container 230 from above the sample table unit 240 by using the maintenance arm 250, in the plasma processing apparatus according to the embodiment illustrated in FIG. 2. Each drawing illustrates an outline of a configuration in a state where each of a plurality of processes of the detaching work is performed, and a work flow is illustrated as a whole.

Figure 15:
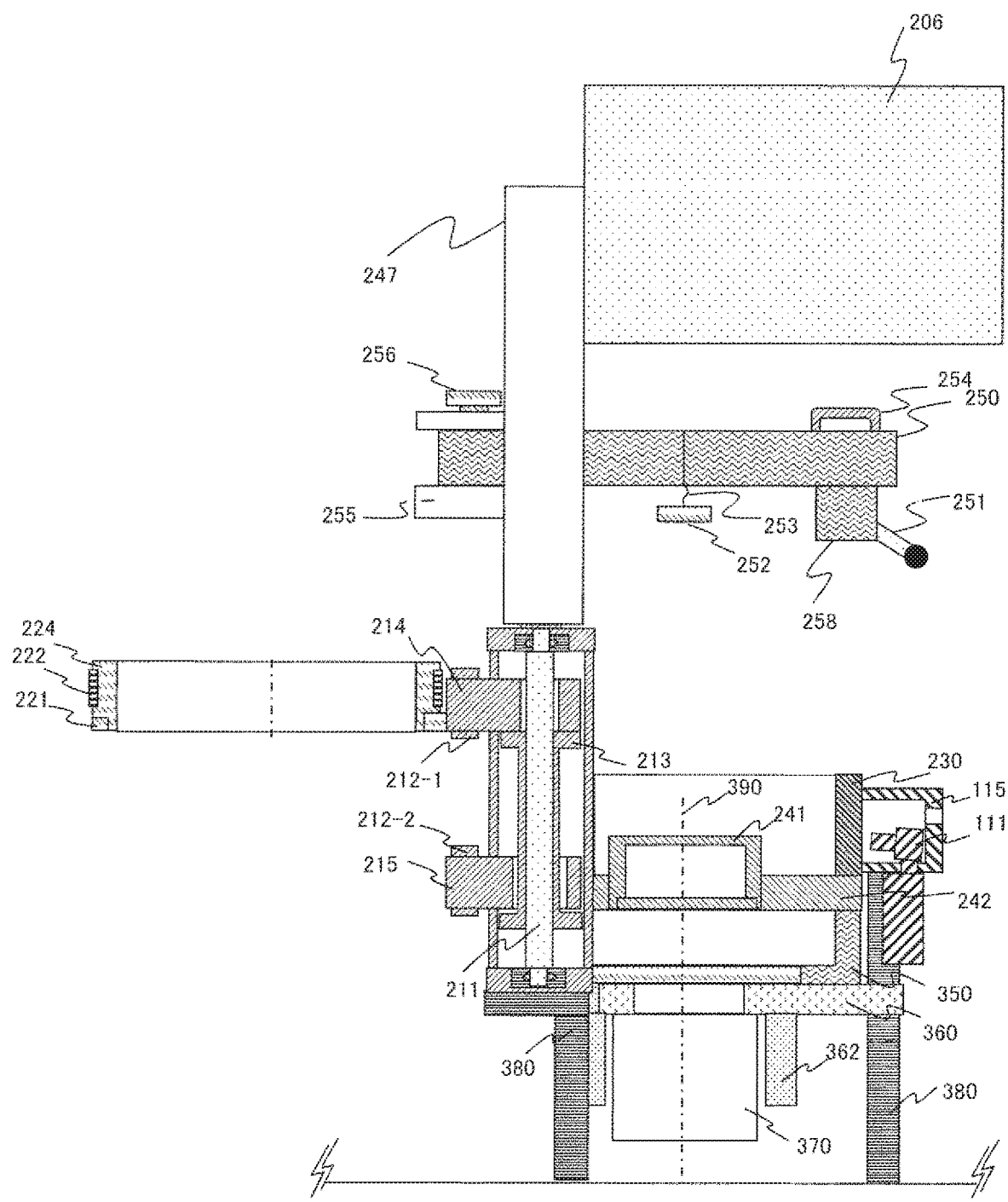
FIG. 15 is a side view or a longitudinal sectional view schematically illustrating an outline of a configuration during work in which the upper container is detached from above the sample table unit by using a maintenance arm, in the plasma processing apparatus according to the embodiment illustrated in FIG. 2.

In FIG. 15, in the vacuum processing unit 200, after the worker confirms that the discharge block unit 220 is turned around the turning shaft 212-1 of the turning base 214 attached to the turning lifter 210, and in a state where the position thereof is fixed by the lock pin (not illustrated) at the position of 180 degrees, and that the sample table unit 240 is turned around the turning shaft 212-2 of the turning base 215, and in a state where the position thereof is fixed by the lock pin (not illustrated) at the position of 25 degrees, the maintenance arm 250 attached to the maintenance arm seat 255 is rotated around the shaft in the upward-and-downward direction of the maintenance arm turning shaft 256, and is moved above the upper container 230 and the center axis 390 of the sample table 241. Prior to the work, the worker detaches a screw portion of a fastening member from a state where the fastening member, such as a bolt, passes through the through-hole of the flange portion disposed on the outer circumferential wall of the upper container 230 and a position at which the flange and the base plate 360 are fastened by the screw portion is fixed, and releases the fastened state.

In the embodiment, by an operation for fastening the fastening member which passes through the flange portion of the upper container 230 and is attached to the base plate 360, the upper container 230, the sample table base 242, and the lower container 350 which are mounted on the base plate 360 are pressed in a direction (downward direction) with respect to the upper surface of the base plate 360 in this order, and a pressing force acts from the upper member to the lower member and the base plate 360 in this order. Accordingly, an external force for deforming the sealing member, such as an O-ring disposed to be interposed between the abutting surfaces, and for airtightly sealing the space between the inside and the outside of the vacuum container, is formed.

Furthermore, the worker rotates the maintenance arm 250 around the shaft in the upward-and-downward direction of the maintenance arm turning shaft 256, and moves the center of the attachment plate 252 disposed via the wire 253 below the maintenance arm 250 above the upper container 230 and the center axis 390 of the sample table 241. The position of the shaft in the upward-and-downward direction of a maintenance arm turning shaft 256 of the embodiment matches the position of the shaft in the upward-and-downward direction of the turning shaft 212 of the turning bases 214 and 215 attached to the turning lifter 210 or is equivalent to the extent of being regarded as the position, and the distance between the axis of the maintenance arm turning shaft 256 and the axis of the attachment plate 252 also matches the distance between the turning shaft 212-2 and the center axis 390 or is equivalent to the extent of being regarded as the distance between the turning shaft 212-2 and the center axis 390. In addition, in the embodiment, at each of the angular positions of 0 degrees, 25 degrees, and 180 degrees, any of the maintenance arm 250 and the turning bases 214 and 215 includes a position fixing member, such as a lock pin, which is fitted to both of the maintenance arm 250 and the turning bases 214 and 215 so as to be capable of fixing the relative angular position of the axes of the turning operation of each of the maintenance arm 250 and the turning bases 214 and 215, that is, the maintenance arm turning shaft 256 and the turning shafts 212-1 and 212-2.

Figure 16:
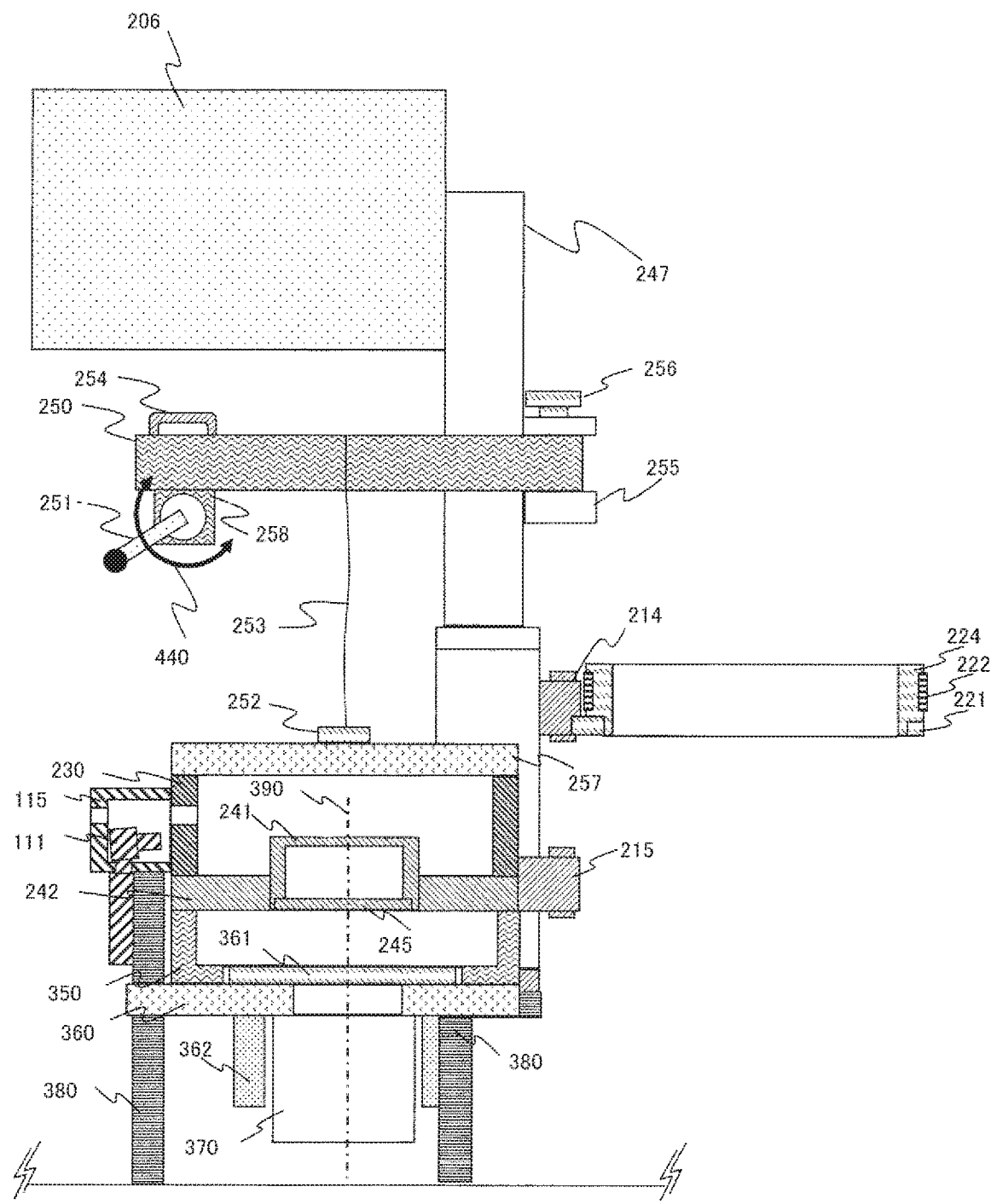
FIG. 16 is a side view or a longitudinal sectional view schematically illustrating an outline of a configuration during the work in which the upper container is detached from above the sample table unit by using a maintenance arm, in the plasma processing apparatus according to the embodiment illustrated in FIG. 2.

The worker attaches the center portion of the beam-shaped linking beam 257 to the attachment plate 252, further rotates the raising and lowering handle 251 (the rotation direction is an arrow 440 in the drawing), drives the winch 258 provided in the maintenance arm 250, feeds the wire 253, and lowers both of the end portions of the linking beam 257 attached to the attachment plate 252 to the upper end of the upper container 230. After this, both of the end portions of the linking beam 257 and the upper end portion of the upper container 230 are connected to each other. This state is illustrated in FIG. 16.

An O-ring which is deformed by a load applied in the upward-and-downward direction is interposed between the bottom surface of the upper container 230 and the upper surface of the upper end portion of the outer circumferential ring-shaped part of the sample table base 242 opposite to the bottom surface. As a result of application of the pressing force and deformation, in order to peel off the O-ring adhering to any of the upper and lower connection surfaces from the connection surface, when detaching the upper container 230, the worker tightens a pressing bolt (not illustrated) provided at a plurality of locations in the circumferential direction of the lower portion of the side surface of the upper container 230, and pushes the tip end of the bolt from above downward with respect to the upper surface portion of the sample table base 242. By doing this, an external force acts in the upward-and-downward direction to affect the connection surfaces, and the O-ring is easily peeled off.

In addition, a buffer material is provided at the tip end of the bolt, and the work does not cause scratches on the bolt pushing surface of the sample table base 242. Therefore, the space for detaching the upper container 230 requiring cleaning is extremely small, and even in a case where it is difficult for the worker to apply an external force when detaching the upper container 230, an increase in amount of work and time is suppressed, and the work efficiency is improved.

Figure 17:
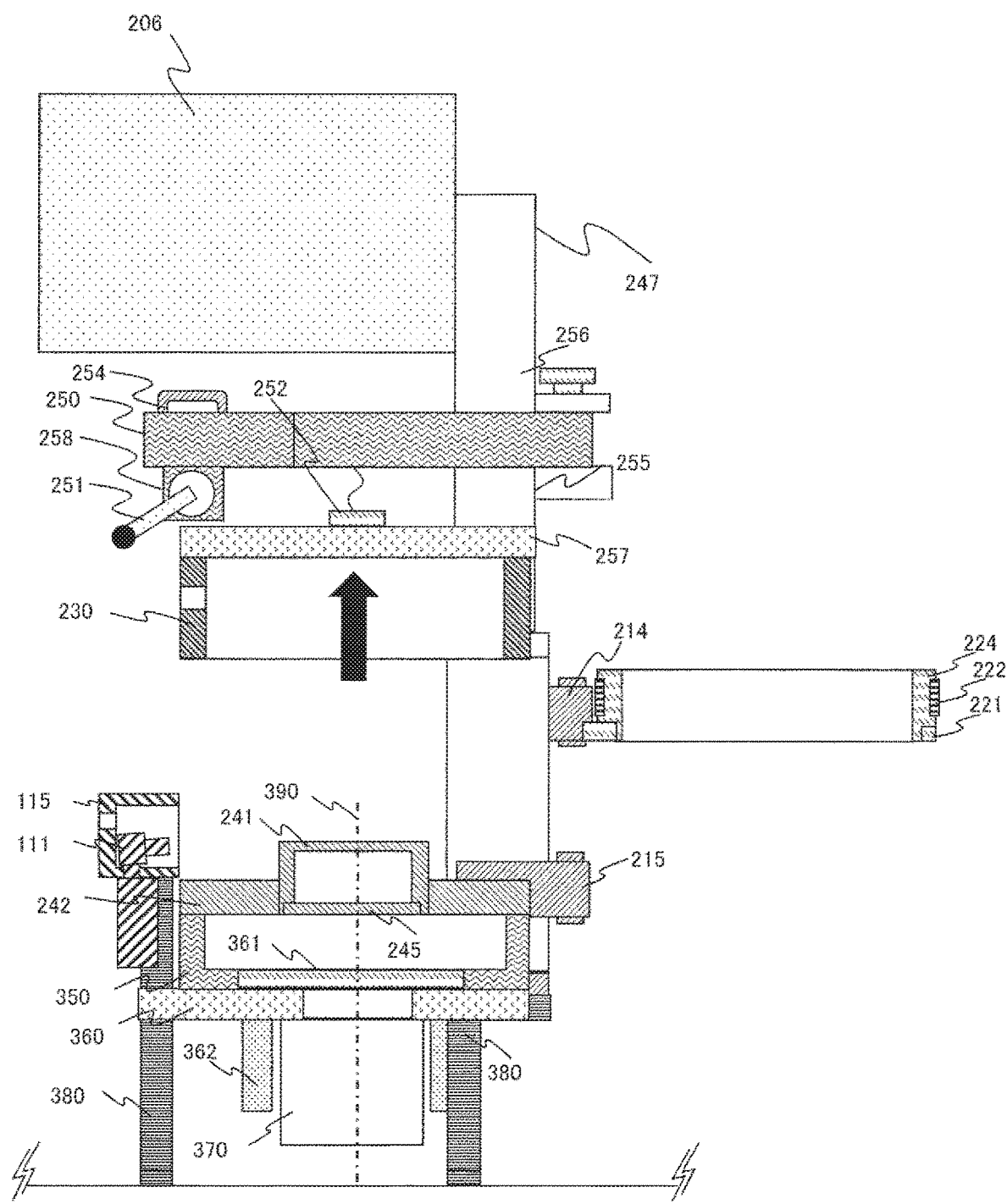
FIG. 17 is a side view or a longitudinal sectional view schematically illustrating an outline of a configuration during the work in which the upper container is detached from above the sample table unit by using the maintenance arm, in the plasma processing apparatus according to the embodiment illustrated in FIG. 2.

Next, the worker rotates the raising and lowering handle 251 of the winch 258 in a direction reverse to that when lowering the winch 258, and winds up the wire 253, and accordingly, in a state where the upper container 230 is held by the linking beam 257 and the attachment plate 252, and the upper container 230 is separated from the sample table base 242 and is raised. In the embodiment, the height of the lower end of the upper container 230 is lifted up to a position higher than the height of the upper end of the discharge block unit 220 moved to the work space. This state is illustrated in FIG. 17. In the drawing, the upper container 230 and the discharge block unit 220 are supported with a distance therebetween in the upward-and-downward direction, and even in a case where the maintenance arm 250 is rotated around the maintenance arm turning shaft 256, a case where both of the upper container 230 and the discharge block unit 220 come into contact with each other and collide with each other, is suppressed.

Figure 18:
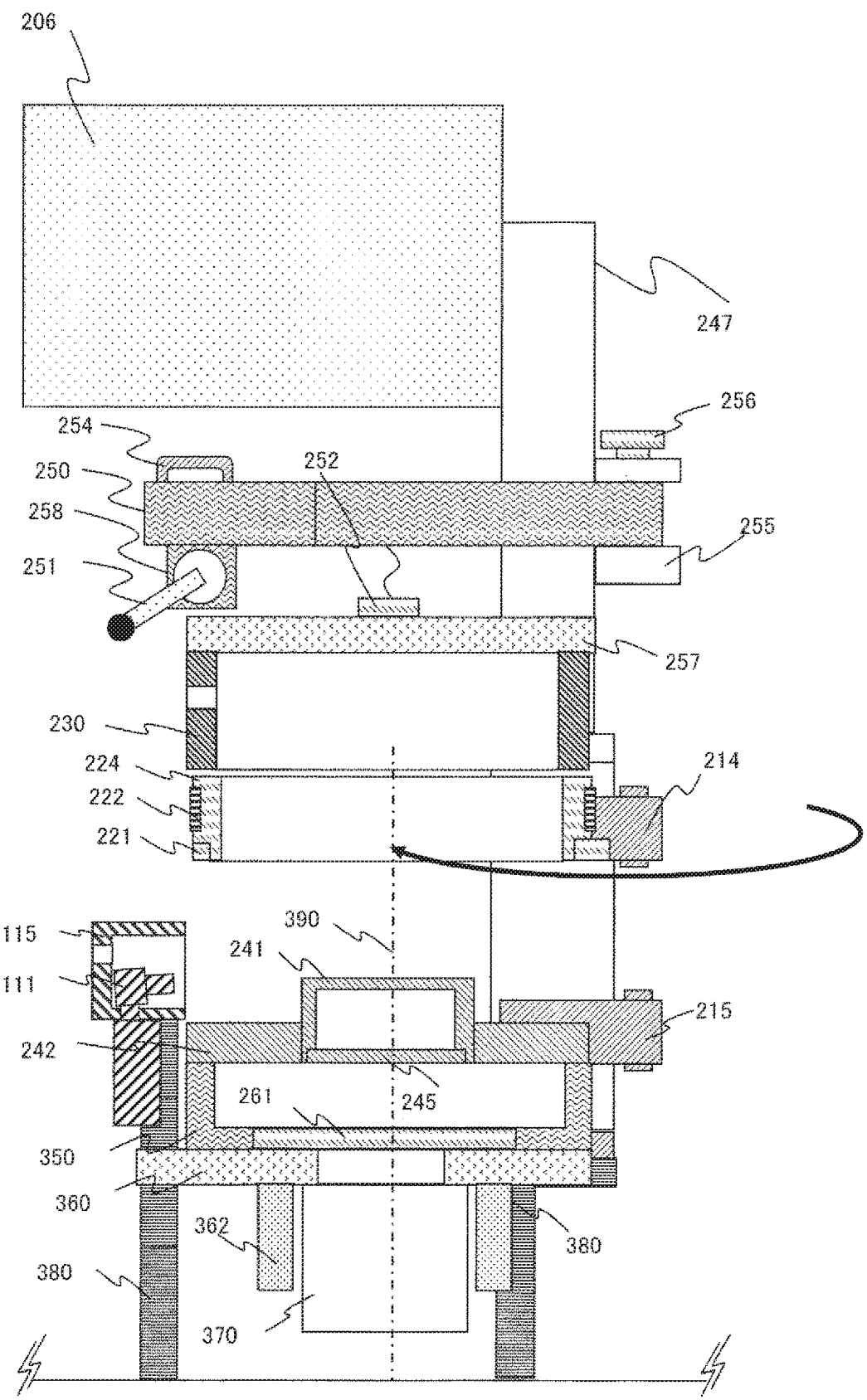
FIG. 18 is a side view or a longitudinal sectional view schematically illustrating an outline of a configuration during the work in which the upper container is detached from above the sample table unit by using the maintenance arm, in the plasma processing apparatus according to the embodiment illustrated in FIG. 2.
Figure 19:
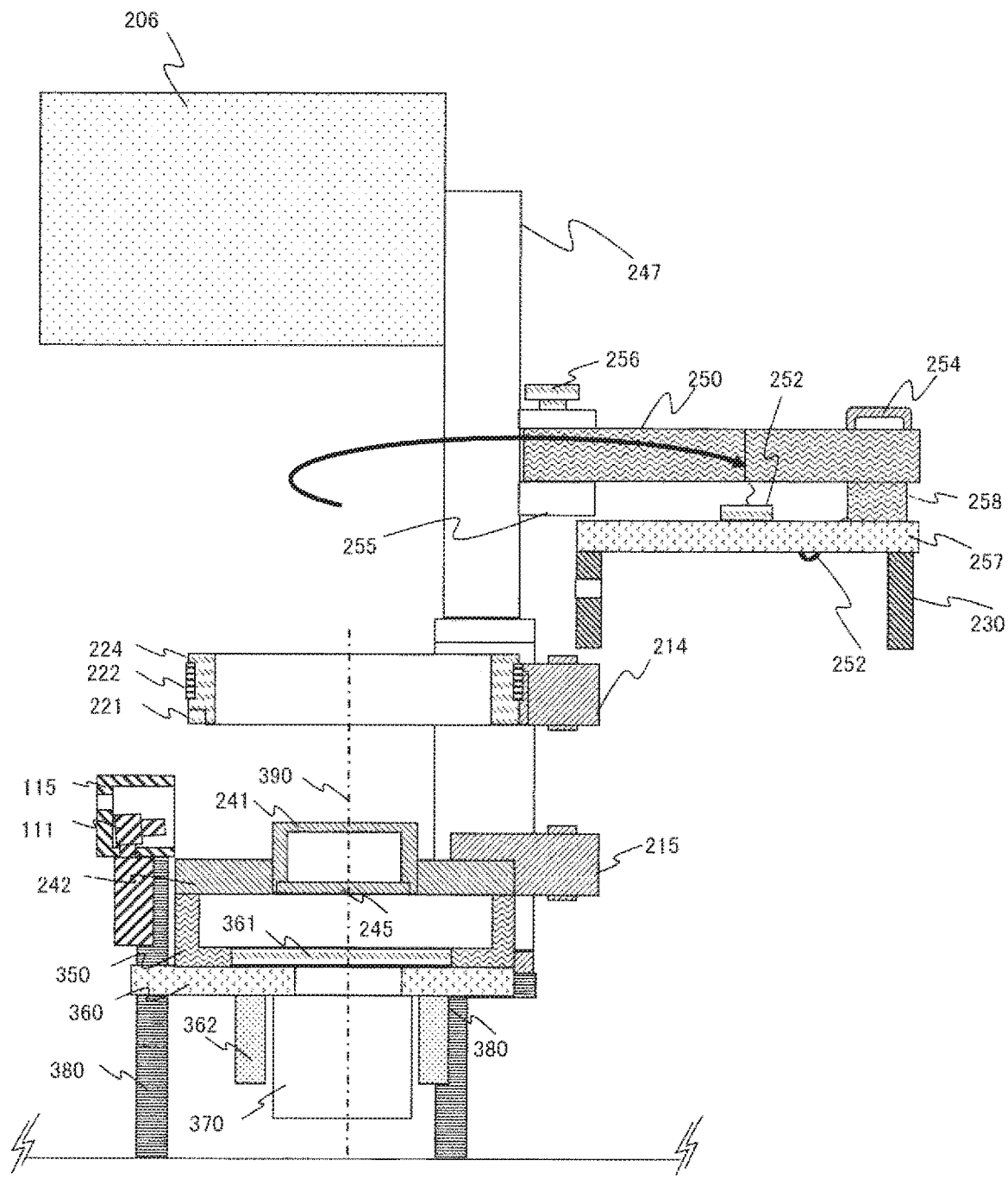
FIG. 19 is a side view or a longitudinal sectional view schematically illustrating an outline of a configuration during the work in which the upper container is detached from above the sample table unit by using the maintenance arm, in the plasma processing apparatus according to the embodiment illustrated in FIG. 2.

Next, the worker turns the turning base 214 and the discharge block unit 220 around the turning shaft 212-1 in the clockwise direction when viewed from above from the position of 180 degrees to the position of 0 degrees, and moves the discharge block unit 220 above the base plate 360, the lower container 350 above the base plate 360, and the sample table unit 240 (FIG. 18). Furthermore, after the work, the worker detaches the lock pin of the maintenance arm 250 held at a position at which the lower sample table unit 240 is held when viewed from above and which matches the angular position of 25 degrees, releases the fixed state, grips the handle 254 in a state where the maintenance arm 250 is rotatable, turns the maintenance arm 250 to the position of 180 degrees, and fixes the maintenance arm 250 using a lock pin (not illustrated) (FIG. 19).

Figure 20:
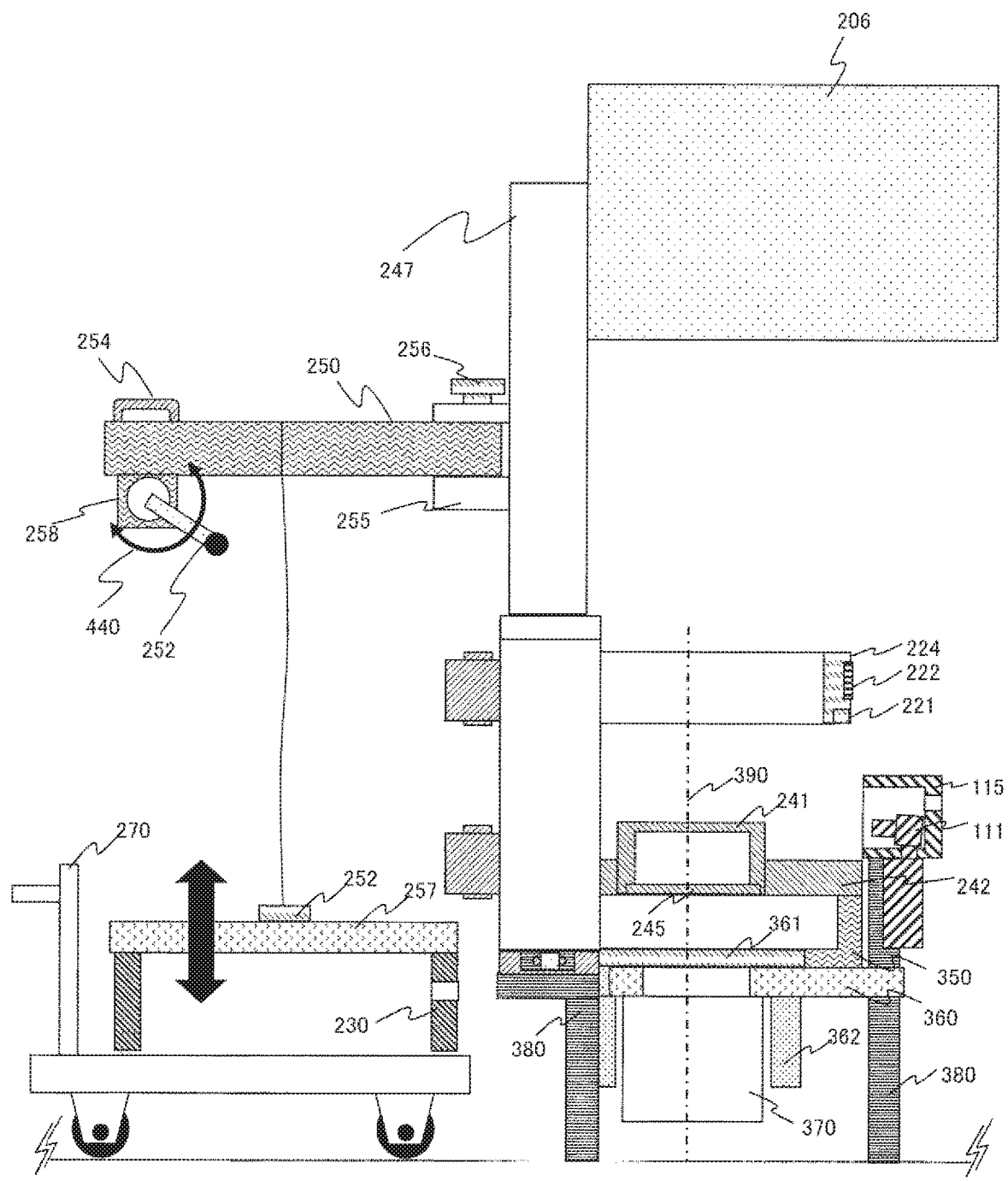
FIG. 20 is a side view or a longitudinal sectional view schematically illustrating an outline of a configuration during the work in which the upper container is detached from above the sample table unit by using the maintenance arm, in the plasma processing apparatus according to the embodiment illustrated in FIG. 2.

In this state, the maintenance arm 250 and the upper container 230 suspended below the maintenance arm 250 are turned in a direction of moving away the valve box 115 and the base plate 360, and as a result, when viewed from above, the entirety is positioned in the work space of the outer region of the base plate 360. The worker rotates the raising and lowering handle 251 in the direction of the arrow in the drawing, operates the winch 258, feeds the wire 253, and lowers the upper container 230 together with the attachment plate 52 and the linking beam 257. The worker moves a component transport cart 270 prepared in advance in the vicinity of the vacuum processing unit 200 to the work space in the vicinity of the outer circumferential edge of the base plate 360 and places the upper container 230 on the upper surface of the loading platform (FIG. 20). When the linking beam 257 is detached from the upper container 230, after the worker operates the raising and lowering handle 251 of the winch 258 and raises the attachment plate 252 and the linking beam 257, the component transport cart 270 and the upper container 230 mounted on the component transport cart 270 are moved.

At this time, after attaching the linking beam 257 to the upper container 230 for exchange mounted on the component transport cart 270 in advance, and moving a new product or the upper container 230 for exchange of which the contamination of the surface is removed and which has been cleaned to be equivalent to the new product, to the angular position of 25 degrees above the sample table unit 240, similar to the description above, by lowering the upper container 230 to the upper part of the sample table base 242 and connecting both of the upper container 230 and the sample table base 242 to each other, the exchange of the upper container 230 may be performed.

In addition, in the embodiment, the movement of the discharge block unit 220 is performed by adjusting the operation of the turning lifter 210 according to a command from the control device. The control device dedicated to the adjustment of the operation of the turning lifter 210, may be disposed, but this function may be provided at a part of the control device that adjusts the overall operation of the vacuum processing unit 200 or the vacuum processing apparatus 100.

By the work illustrated in FIGS. 15 to 20, the upper container 230 is detached from above the base plate 360, and the sample table base 242 including the sample table 241, the support beam 246, and the ring-shaped part disposed on the outer circumferential side thereof are exposed above the base plate 360. Next, with reference to FIGS. 22 to 26, in the vacuum processing apparatus 100 of the embodiment, a procedure in which the lower container 350 is detached from the vacuum processing unit 200 or the lower base plate 360 by using the maintenance arm 250 and the winch 258 will be described.

FIGS. 21 to 26 are side views or longitudinal sectional views schematically illustrating an outline of a configuration during the work in which the lower container 350 is detached from above the base plate 360 by using the maintenance arm 250, in the plasma processing apparatus according to the embodiment illustrated in FIG. 2. Each drawing illustrates an outline of a configuration in a state where each of a plurality of processes of the detaching work is performed, and a work flow is illustrated as a whole.

Figure 21:
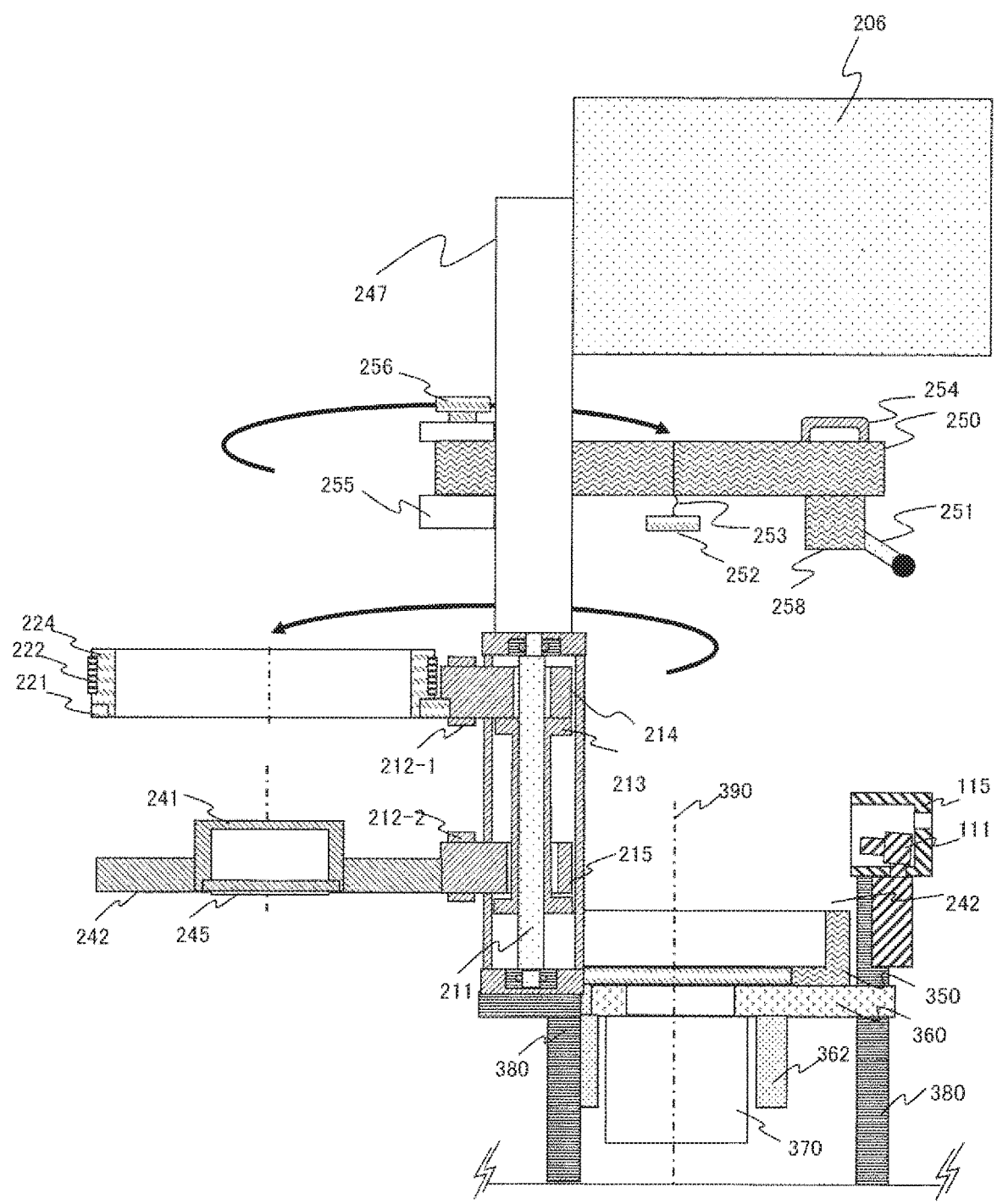
FIG. 21 is a side view or a longitudinal sectional view schematically illustrating an outline of a configuration during the work in which the upper container is detached from above the sample table unit by using the maintenance arm, in the plasma processing apparatus according to the embodiment illustrated in FIG. 2.

In a state where the upper container 230 is detached from the sample table unit 240, the worker first turns the maintenance arm 250 in the horizontal direction and is moved to the position of 25 degrees or 0 degrees, and the discharge block unit 220 is turned horizontally and is moved to the position of 180 degrees (FIG. 21). In the state illustrated in FIG. 21, each of the discharge block unit 220 and the sample table unit 240 is turned and moved to the angular position of 180 degrees around the turning shaft 212-1 and the turning shaft 212-2. By rotating the sample table unit 240 around the turning shaft 212-2 and by moving the sample table unit 240 to the region on the outside of the base plate 360, the lower container 350 is exposed upward as a member that configures the vacuum container left on the base plate 360 of the vacuum processing unit 200. In addition, the upper surface of the circular exhaust portion lid 361 disposed on the inside of the exhaust opening at the center of the bottom portion of the lower container 350 is exposed.

Figure 22:
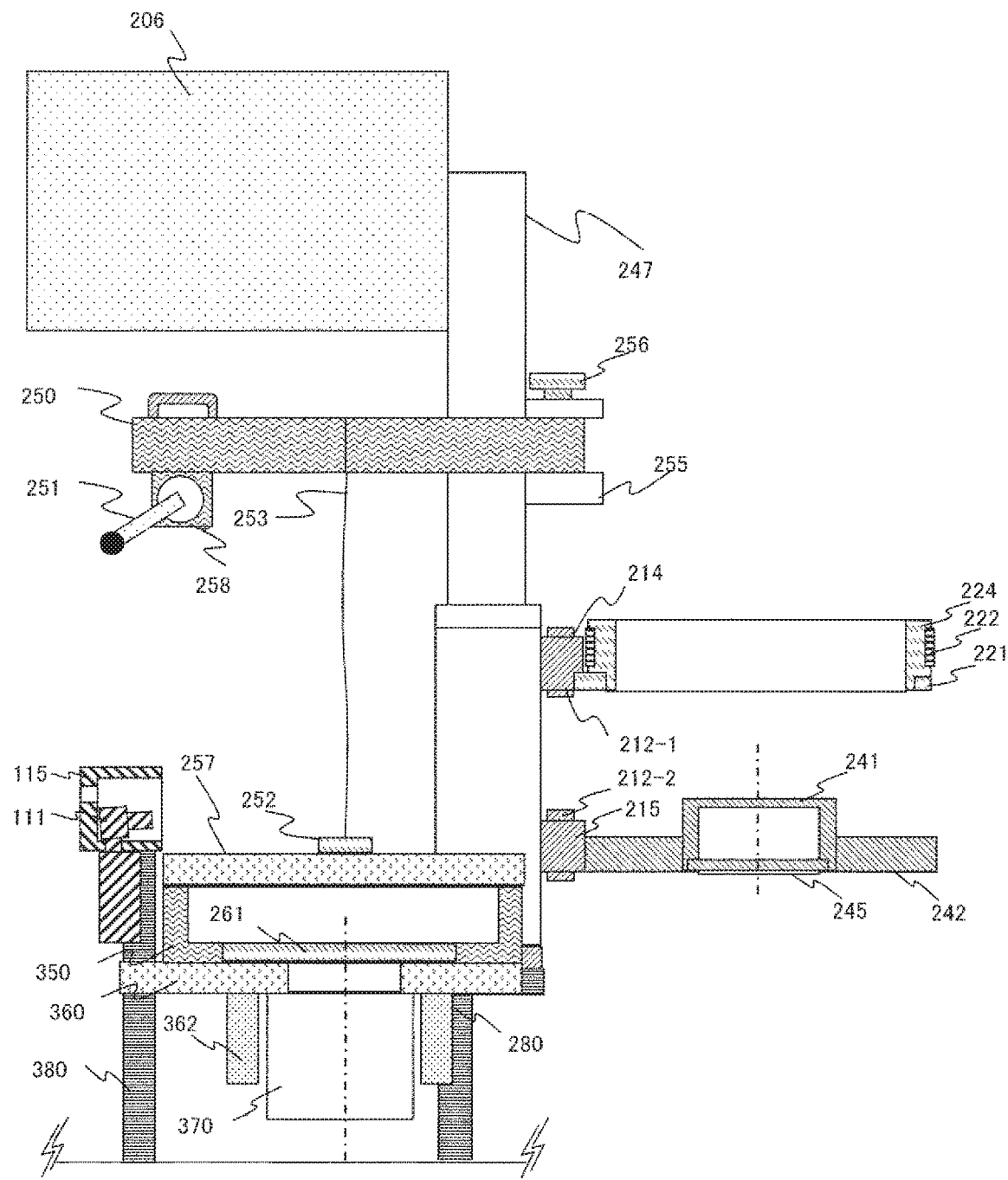
FIG. 22 is a side view or a longitudinal sectional view schematically illustrating an outline of a configuration during work in which the lower container is detached from above abase plate by using the maintenance arm, in the plasma processing apparatus according to the embodiment illustrated in FIG. 2.

Next, after the fastening member, such as a bolt, which fastens the flange portion of the lower container 350 and the base plate 360 to each other is detached, the worker rotates the maintenance arm 250 clockwise around the center axis of the turning shaft 256, and is moved to the position of 0 degrees by the lock pin (not illustrated). In this state, the center portion of the attachment plate 252 is disposed at a position which approximately matches the center of the lower container 350 or the exhaust portion lid 361. As necessary, the linking beam 257 is connected to the attachment plate 252, the raising and lowering handle 251 of the winch 258 is rotated and operated to feed the wire 253 to lower the attachment plate 252 and the linking beam 257, the attachment plate 252 approaches the vicinity of the upper end portion of the lower container 350, and both of the attachment plate 252 and the lower container 350 are connected to each other by connecting means, such as bolts (FIG. 22).

An O-ring 207 is interposed between the bottom surface of the lower container 350 and the upper surface of the base plate 360 that faces the lower container 350 in a state where the lower container 350 is attached, by a load applied in the vertical direction. In order to peel off the O-ring 207 that is deformed and adheres to any of the upper and lower surfaces when detaching the lower container 350, the worker tightens pressing bolts (not illustrated) provided at a plurality of locations in the circumferential direction of the lower portion of the side surface of the lower container 350, pushes the upper surface portion of the base plate 360 at the tip of the bolt, and accordingly, peels off the O-ring 207 by a load applied in the upward-and-downward direction.

The buffer material is provided at the tip end of the bolt, and the work does not cause scratches on the bolt pushing surface of the base plate 360. Therefore, the space for detaching the lower container 350 requiring cleaning is extremely small, and even in a case where it is difficult for the worker to apply an external force when detaching the lower container 350, an increase in amount of work and time is suppressed, and the work efficiency is improved.

Figure 23:
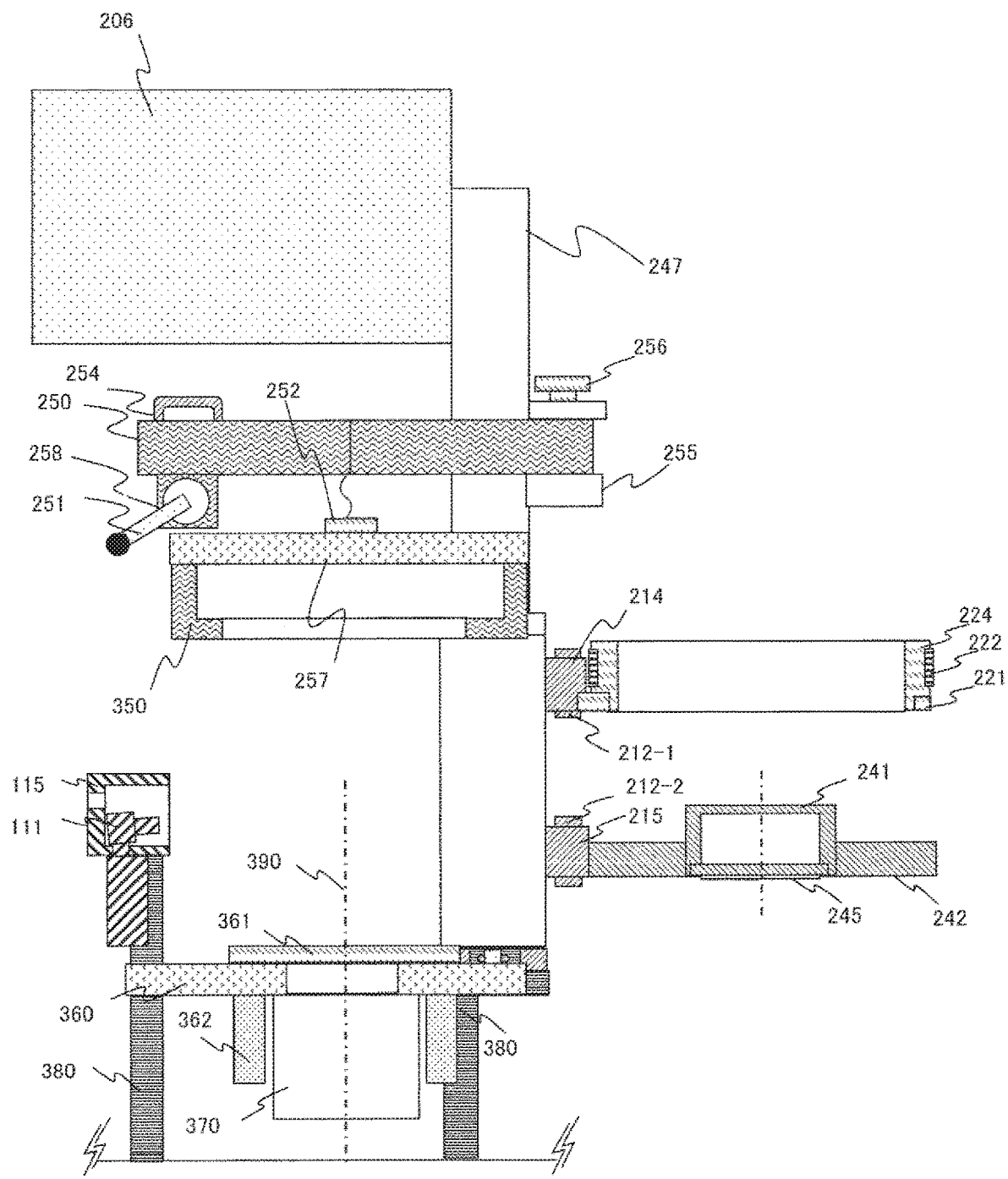
FIG. 23 is a side view or a longitudinal sectional view schematically illustrating an outline of a configuration during the work in which the lower container is detached from above the base plate by using the maintenance arm, in the plasma processing apparatus according to the embodiment illustrated in FIG. 2.
Figure 24:
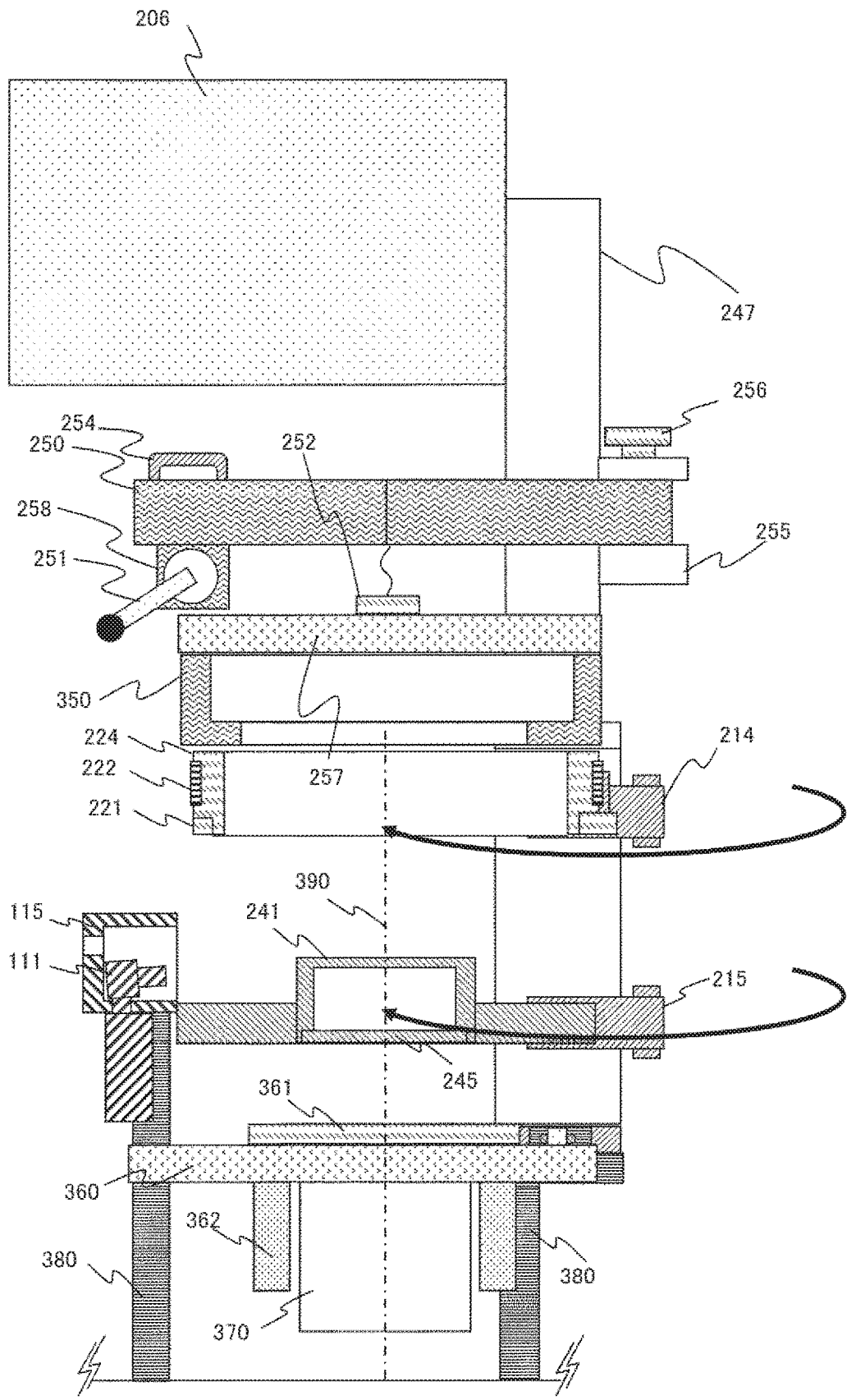
FIG. 24 is a side view or a longitudinal sectional view schematically illustrating an outline of a configuration during the work in which the lower container is detached from above the base plate by using the maintenance arm, in the plasma processing apparatus according to the embodiment illustrated in FIG. 2.

Next, the worker rotates the raising and lowering handle 251 to operate the winch 258 to wind up the wire 253, and in a state where the lower container 350 connected to the attachment plate 252 and the linking beam 257 is suspended and held by the maintenance arm 250, and the worker raises the lower container 350 upward. Regarding the lower container 350, similar to the case of detaching the upper container 230, the upper end of the discharge block unit 220 and the lower end of the lower container 350 are lifted up to a position at a distance in the height direction (FIG. 23). In this state, when the discharge block unit 220 is turned around the turning shaft 212-1 and is moved above the base plate 360, collision or contact between the lower container 350 and the discharge block unit 220 is suppressed.

Figure 25:
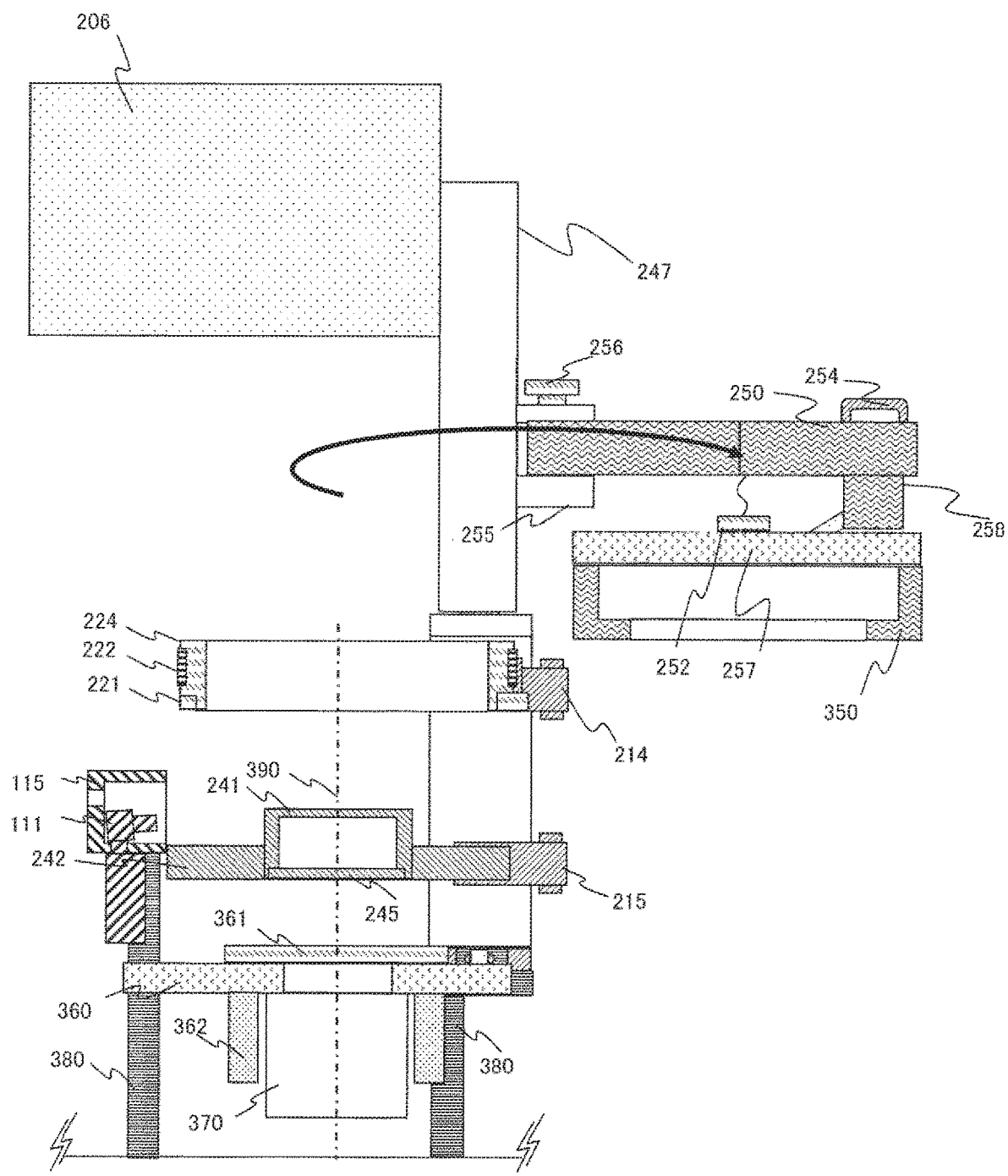
FIG. 25 is a side view or a longitudinal sectional view schematically illustrating an outline of a configuration during the work in which the lower container is detached from above the base plate by using the maintenance arm, in the plasma processing apparatus according to the embodiment illustrated in FIG. 2.

After this, the worker detaches the lock pin of the maintenance arm 250, grips the handle 254 in a state where the maintenance arm 250 is rotatable, and moves the maintenance arm 250 by turning the maintenance arm 250 to a position of 0° to 180°. At the position of 180 degrees, the rotation movement or the angular position of the maintenance arm 250 is fixed by the operation of the lock pin (not illustrated) (FIG. 25). In this state, the maintenance arm 250 and the lower container 350 suspended below the maintenance arm 250 is turned in a direction of being separated from the valve box 115 and the base plate 360, and as a result, when viewed from above, the entirety is positioned in the work space of the outer region of the base plate 360.

Figure 26:
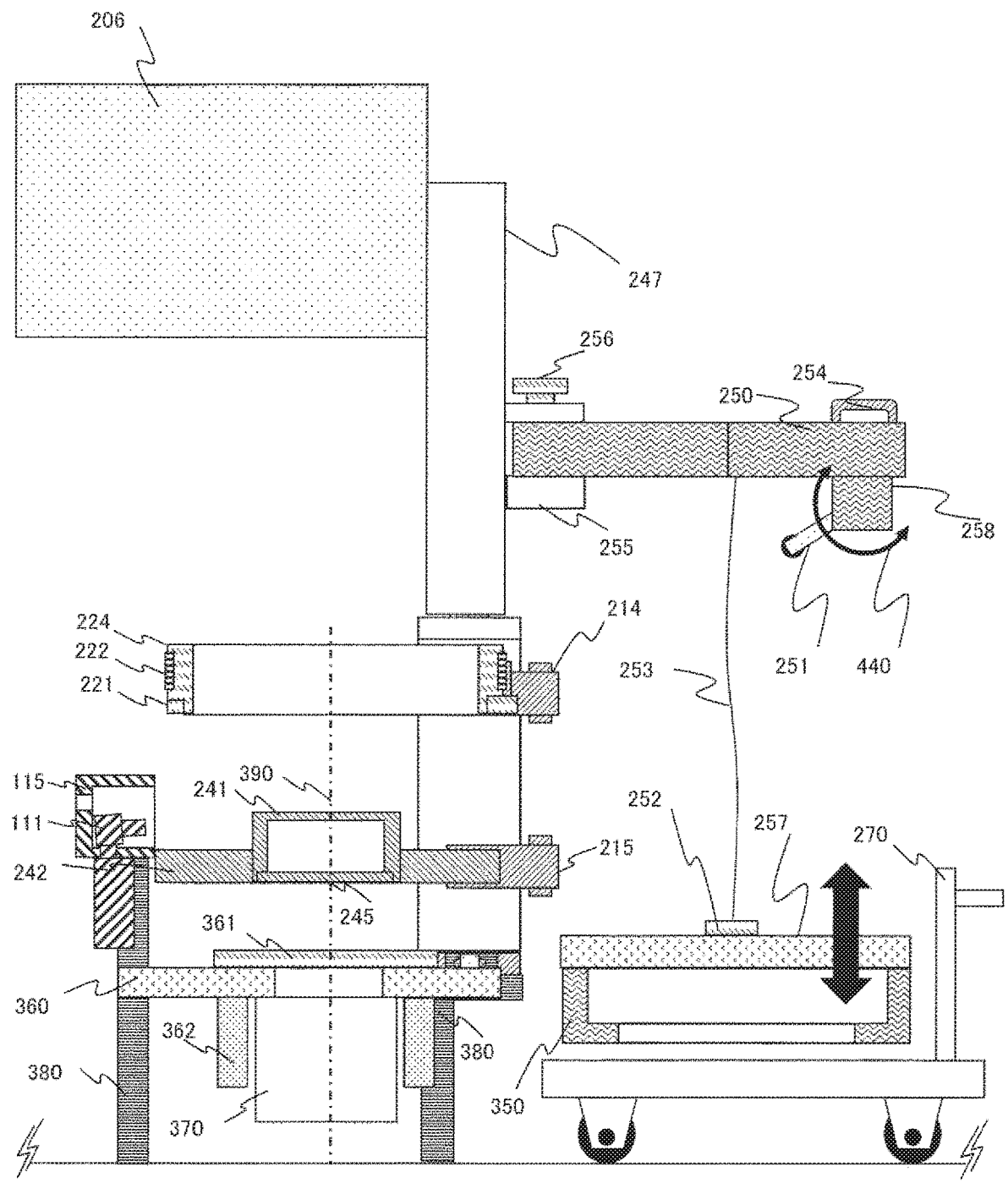
FIG. 26 is a side view or a longitudinal sectional view schematically illustrating an outline of a configuration during the work in which the lower container is detached from above the base plate by using the maintenance arm, in the plasma processing apparatus according to the embodiment illustrated in FIG. 2.

Next, the worker rotates the raising and lowering handle 251, operates the winch 258, pulls out the wire 253, and lowers the lower container 350 connected to the attachment plate 252 and the linking beam 257 together with the attachment plate 252 and the linking beam 257. In addition, the lower container 350 is lowered until being mounted on the loading platform of the component transport cart 270 prepared and disposed in advance below the maintenance arm 250 of the work space around the base plate 360 (FIG. 26). After detaching the linking beam 257 from the upper end of the lower container 350, the worker rotates the raising and lowering handle 251 to operate the winch 258 to raise the attachment plate 252 and the linking beam 257, and the component transport cart 270 on which the lower container 350 is mounted is moved.

At this time, after attaching the linking beam 257 to the lower container 350 for replacement mounted on the component transport cart 270 in advance, and moving a new product or the lower container 230 for replacement of which the contamination of the surface is removed and which has been cleaned to be equivalent to the new product to the angular position of 25 degrees above the sample table unit 240, similar to the description above, by lowering the lower container 350 to the upper part of the base plate 360 and connecting both of the lower container 350 and the base plate 360 to each other with the sealing member, such as an O-ring, interposed therebetween, the replacement of the lower container 350 may be performed.

In a state where the lower container 350 is detached above the base plate 360, the upper surface of the base plate 360 and the upper surface of the exhaust portion lid 361 are exposed to the atmosphere around the apparatus in the building where the vacuum processing apparatus 100 is disposed. With respect to these, maintenance and inspection work can be performed.

Since the exposed portion of the base plate 360 is covered with the lower container 350, the adhesion of reaction products is relatively small. In addition, the upper surface of the exhaust portion lid 361 having a circular shape is disposed at a position at which the sample table 241 and the center axis of the sample table 241 matches each other or at the position equivalent thereto, the diameter thereof does not exceed the diameter of the sample table 241 having a cylindrical shape, and thus, the amount of the adhesion of reaction products formed during the processing with respect to the wafer 300 is relatively small. These can be cleaned as necessary.

After the upper container 230 and the lower container 350 are detached from the vacuum processing unit 200 in this manner, replacement work or maintenance and inspection work for the vacuum processing unit 200, such as replacement and cleaning of the members that configure the vacuum container are performed, and then, the members which configure the vacuum container together with the replacement upper container 230 and the lower container 350 are attached onto the base plate 360 and the vacuum container is assembled in an order reverse to that when detaching the members.

In the above-described embodiment, a configuration in which the sample table unit 240 is turned in the counterclockwise direction around the turning shaft 212-2 attached to one turning lifter 210 attached to the outer circumferential portion on the outer circumferential portion of the base plate 360. However, the invention is not limited thereto, and a configuration in which a position at which the turning lifter 210 is disposed in the outer circumferential edge portion of the base plate 360 is disposed at a position different from that of the embodiment and is turned in the clockwise direction, can also be employed. In addition, the distance to move the sample table unit 240 upward is set to be equal to or greater than the height by which the O-ring 207 which is disposed below the sample table unit 240 and is interposed between the sample table unit 240 and the lower container 350 on which the sample table unit 240 is mounted is peeled off from the sample table unit 240 or the lower container 350. Such a height is set to 1 cm in the embodiment, but the height is not limited thereto. In addition, the movement of the sample table unit 240 is also performed by a control device that controls the turning lifter 210.

The turning shafts 212-1 and 212-2 which are disposed at the two upper and lower height positions are disposed so that the position of the shaft viewed from above matches or substantially matches the side of the direction in which the arm in the transport direction of the wafer 300 extends by the arm of the atmospheric transport chamber 106 of the turning lifter 210. Accordingly, it is possible to realize an angle of rotation only by making it possible to move the discharge block unit 220 and the sample table unit 240 that are turned and moved around the turning shaft 212 to the work space around the vacuum processing unit 200.

In addition, it is desirable that the angle at which the sample table unit 240 is turned is set to be the same as that of the discharge block unit 220. Accordingly, in the middle of the maintenance work, it is possible to reduce the total area occupied by both of the discharge block unit 220 and the sample table unit 240 when viewed from above. As a result, an increase in work space between the adjacent vacuum processing apparatuses is suppressed, by increasing the number of installable vacuum processing apparatuses in the building where the vacuum processing apparatus 100 is disposed, it is possible to increase the efficiency of manufacturing a semiconductor device.

In addition, by turning and moving the structure including the sample table 241 collectively with one unit as the sample table unit 240, it is possible to easily perform the detaching work of the part that configures the vacuum container, such as the sample table 241, from the vacuum processing unit 200, during a short period of time. Since the wafer 300 is placed on the placing surface of the upper surface of the sample table 241 during the processing, it is difficult for the reaction products to adhere relatively to each other, and thus, maintenance, such as replacement of the upper container 230 and the lower container 350, and maintenance and inspection work will not be carried out at all times when conducting inspection. Here, by detaching such components including the sample table 241 as a sample table unit 240 from the upper part of the lower container 350 and moving the sample table unit 240, it is possible to suppress an increase in amount and time of the maintenance and inspection work of the lower container 350.

In addition, the position of the shaft of the maintenance arm turning shaft 256 is made to match or substantially match the turning shafts 212-1 and 212-2 when viewed from above. Furthermore, in the embodiment, a configuration in which the rotation angle around the maintenance arm turning shaft 256 of the maintenance arm 250 matches and is fixed to a specific turning angle by which the lower discharge block unit 220 and the sample table unit 240 which are position at the lower part are fixed by the lock pin. Therefore, a case where the containers vibrate or shift in position during the raising and lowering the upper container 230 or the lower container 350 in the upward-and-downward direction during the attaching or detaching work, and contact or collision with other members is caused, is suppressed. Furthermore, similar to the discharge block unit 220 and the sample table unit 240, by removing the upper container 230 and the lower container 350 from the region above the base plate 360 and moving the upper container 230 and the lower container 350 to the work space around the vacuum processing unit 200, it is possible to improve the work efficiency of the maintenance work of the worker with respect to the members.

The traveling nut 213 disposed on the inside of the turning lifter 210 of the embodiment is configured to be capable of holding the height position by moving to the three height positions different in the upward-and-downward direction on the vertical shaft 211 of the turning lifter 210, for performing the maintenance work for detaching the lid member 202, the shower plate 203, the gas introduction ring 204, the quartz inner cylinder 205, the discharge block unit 220, the earth ring 225, the upper container 230, the sample table unit 240, and the lower container 350 which configure the vacuum container, from the main body of the vacuum processing unit 200. In other words, (1) a lower limit position (detaching the lid member 202, the shower plate 203, the gas introduction ring 204, and the quartz inner cylinder 205), (2) intermediate position (detaching the discharge block unit 220, the earth ring 225, and the upper container 230), and (3) upper end position (detaching the sample table unit 240 and the lower container 350).

In the embodiment, the above-described three positions of the traveling nut 213 are configured to be grasped by the worker with a position sensor, scale, and the like interlocked with the display lamp (not illustrated).

In addition, in the embodiment, not only the upper container 230 but also the lower container 350 is replaced, but a liner (cover) may be attached so as to cover the inner surface of the lower container 350, and the liner may be replaced. In addition, in the embodiment, a configuration in which the movement of components other than the discharge block unit 220 and the sample table unit 240 which are moved by using the turning lifter 210 in the maintenance work is manually performed by the worker, is employed, but a hoist, such as a crane, may be used.

In addition, in the embodiment, an ECR type vacuum processing apparatus is used as the vacuum processing apparatus, but the invention is not limited thereto, and can also be applied to ICP type apparatuses and the like. In addition, although the vacuum processing apparatus including the vacuum processing unit arranged by the link method is used, the vacuum processing apparatus is not limited thereto and can also be applied to a cluster type apparatus.

As described above, according to the embodiment, even in a case where the diameter of the workpiece is increased, the uniformity of processing is excellent (coaxial axisymmetric exhaust), and only by normal maintenance, it is possible to provide a vacuum processing apparatus which is capable of efficiently performing unnormal maintenance.

In addition, the invention is not limited to the above-described embodiments, but includes various modification examples. For example, the above-described embodiments have been described in detail in order to make it easy to understand the invention, and are not necessarily limited to those having all the configurations described. In addition, it is also possible to replace a part of a configuration with another configuration, and another configuration can be added to a certain configuration.

What is claimed is:

1. A vacuum processing apparatus comprising:
   at least one vacuum transport chamber in which a wafer that is a processing target is transported in a decompressed space;
   a plurality of vacuum processing units each of which includes a vacuum container constituting a vacuum processing chamber in which the wafer disposed on the decompressed inside is processed by using plasma, and a base plate on which the vacuum container is mounted and which has an opening through which a gas from the processing chamber on the inside of the vacuum processing chamber is exhausted, and the vacuum container being coupled to the at least one vacuum transport chamber in an attachable and detachable manner; and
   an atmospheric transport chamber which is connected to said at least one vacuum transport chamber with a lock chamber interposed therebetween, and which is constructed to transport the wafer on an inside of the atmospheric transport chamber having an atmospheric pressure,
   wherein each of the vacuum processing units is configured to provide a work space between one said vacuum processing unit and an adjacent vacuum processing unit, or between one said vacuum processing unit and the atmospheric transport chamber,
   wherein at least one of the vacuum processing units includes a turning lifter which is disposed at an outer circumferential position of the base plate between the work space and the vacuum container mounted on the base plate,
   wherein the vacuum container of the at least one vacuum processing unit includes a sample table unit comprising a sample table base, a sample table, and a sample table bottom portion lid, and the vacuum container further including an upper container mounted above the sample table unit, and said turning lifter of the vacuum container includes a vertical shaft, and the at least one vacuum processing unit further includes a maintenance arm which is disposed above said turning lifter and which is attached to the turning lifter and is configured to turn in a horizontal direction around a maintenance arm turning shaft disposed above the vertical shaft of said turning lifter and to lift said upper container in a vertical direction using a winch and an attachment member affixed to the upper container such that the upper container becomes suspended in a lifted state,
   wherein the sample table unit is coupled to the turning lifter via a turning shaft of a turning base and is configured to be capable of turning around said turning shaft of the turning base and is capable of being locked in a fixed position to maintain a predetermined angular position, and
   wherein the maintenance arm turning shaft is disposed at a position which is aligned with the turning shaft of the turning base when viewed from above in plan view, and the maintenance arm is configured to be locked in a fixed angular position above the sample table unit such that a center portion of the maintenance arm is directly aligned, when viewed above in the plan view, with the center of the sample table unit when said sample table unit is locked in the predetermined angular position.

2. The vacuum processing apparatus according to claim 1, wherein the vacuum container of the at least one vacuum processing unit further comprises:
   a sealing O-ring which is interposed between the upper container and the sample table base along an outer circumferential wall,
   wherein a vertical axis of said vertical shaft of the turning lifter is parallel to a direction along which the sample table unit moves upward-and-downward.

3. The vacuum processing apparatus according to claim 1, further comprising:
   a robot which is disposed inside of the vacuum transport chamber, on which the wafer is mounted, and which moves the wafer between the vacuum processing chamber of the at least one vacuum processing unit and the vacuum transport chamber, wherein the maintenance arm turning shaft is disposed on a side opposite to the vacuum transport chamber.

4. The vacuum processing apparatus according to claim 1, wherein the upper container has a gate through which the wafer is transported, and wherein the vacuum processing apparatus further comprises:

a gate valve which abuts against a wall surface of the gate's outer circumference on the outside of the upper container and which airtightly closes and opens communication between an inside and an outside of the gate; and a valve box which includes the gate valve therein, and which is connected to the outer wall surface of the upper container between the upper container and the vacuum transport chamber, and which airtightly partitions an interior space to which the wafer is transported.

5. The vacuum processing apparatus according to claim 1, wherein when the upper container is lifted and in the suspended state by the maintenance arm and is detached from the sample table unit at the predetermined angle, a position of the maintenance arm above a center portion of a lower container is fixed.

6. The vacuum processing apparatus according to claim 1, wherein the vacuum container of the at least one vacuum processing unit further includes a discharge block that is disposed above the upper container and generates an electric field or a magnetic field for generating plasma in the processing chamber, and wherein the turning lifter moves the discharge block upward and downward.

* * * * *